(12) United States Patent
Kishino

(10) Patent No.: US 12,388,409 B2
(45) Date of Patent: Aug. 12, 2025

(54) COMPOSITE FILTER AND COMMUNICATION DEVICE

(71) Applicant: KYOCERA Corporation, Kyoto (JP)

(72) Inventor: Tetsuya Kishino, Nara (JP)

(73) Assignee: KYOCERA Corporation, Kyoto (JP)

( * ) Notice: Subject to any disclaimer, the term of this patent is extended or adjusted under 35 U.S.C. 154(b) by 221 days.

(21) Appl. No.: 18/044,880

(22) PCT Filed: Sep. 10, 2021

(86) PCT No.: PCT/JP2021/033259
§ 371 (c)(1),
(2) Date: Mar. 10, 2023

(87) PCT Pub. No.: WO2022/054896
PCT Pub. Date: Mar. 17, 2022

(65) Prior Publication Data
US 2023/0344401 A1    Oct. 26, 2023

(30) Foreign Application Priority Data

Sep. 11, 2020 (JP) ................. 2020-152617

(51) Int. Cl.
| | |
|---|---|
| H03H 7/46 | (2006.01) |
| H01P 5/22 | (2006.01) |
| H03H 9/64 | (2006.01) |
| H03H 9/72 | (2006.01) |
| H04B 1/00 | (2006.01) |

(52) U.S. Cl.
CPC ............ *H03H 7/463* (2013.01); *H01P 5/227* (2013.01); *H03H 9/6483* (2013.01); *H03H 9/725* (2013.01); *H04B 1/0057* (2013.01)

(58) Field of Classification Search
CPC ...... H03H 7/463; H03H 9/6483; H03H 9/725; H03H 7/46; H03H 9/72; H01P 5/227; H01P 1/397; H04B 1/0057
See application file for complete search history.

(56) References Cited

U.S. PATENT DOCUMENTS

| | | | |
|---|---|---|---|
| 9,048,805 B2* | 6/2015 | Granger-Jones | ....... H04B 1/525 |
| 9,196,945 B2* | 11/2015 | Khlat | ................. H04B 1/0057 |
| 10,855,246 B2* | 12/2020 | Mandegaran | ............ H01P 5/18 |
| 2010/0148886 A1 | 6/2010 | Inoue et al. | |
| 2013/0234806 A1 | 9/2013 | Schmidhammer et al. | |
| 2014/0049337 A1 | 2/2014 | Schmidhammer | |

(Continued)

FOREIGN PATENT DOCUMENTS

| | | |
|---|---|---|
| JP | 2013-545325 A | 12/2013 |
| JP | 2014-511626 A | 5/2014 |

(Continued)

*Primary Examiner* — Andrea Lindgren Baltzell
*Assistant Examiner* — Kimberly E Glenn
(74) *Attorney, Agent, or Firm* — Volpe Koenig

(57) ABSTRACT

A splitter simultaneously inputs two signals having different frequencies within a transmission band to a transmission terminal. A transmission filter system and a reception filter system that are connected to an antenna terminal share a first hybrid coupler. Two transmission filters and a second hybrid coupler are located between the first hybrid coupler and the transmission terminal. A reception filter is located between the first hybrid coupler and the reception terminal.

8 Claims, 15 Drawing Sheets

(56) References Cited

U.S. PATENT DOCUMENTS

| | | |
|---|---|---|
| 2015/0222300 A1 | 8/2015 | Schmidhammer et al. |
| 2015/0236390 A1* | 8/2015 | Analui ................... H03H 9/547 |
| | | 333/117 |
| 2018/0254766 A1 | 9/2018 | Shimozono |

FOREIGN PATENT DOCUMENTS

| | | |
|---|---|---|
| JP | 2015-530810 A | 10/2015 |
| WO | 2009/078095 A1 | 6/2009 |
| WO | 2016/159053 A1 | 10/2016 |

* cited by examiner

COMPOSITE FILTER AND COMMUNICATION DEVICE

TECHNICAL FIELD

The present disclosure relates to a composite filter having two or more filters, and to a communication device including the composite filter.

BACKGROUND OF INVENTION

A known composite filter includes two or more filters. Patent Literatures 1 to 4 indicated below disclose a duplexer as a composite filter. The duplexer includes a transmission filter that filters a high-frequency signal (transmission signal) input from a transmission terminal and outputs the high-frequency signal to an antenna, and a reception filter that filters the high-frequency signal (reception signal) input from the antenna and outputs a high-frequency signal to a reception terminal. In Patent Literatures 1 to 4, the transmission filter and the reception filter are connected to the antenna via a 90° hybrid coupler to enhance isolation between the transmission filter and the reception filter.

CITATION LIST

Patent Literature

Patent Literature 1: PCT International Publication No. WO 2009/078095
Patent Literature 2: PCT Japanese Translation Patent Publication No. 2015-530810
Patent Literature 3: PCT Japanese Translation Patent Publication No. 2013-545325
Patent Literature 4: PCT Japanese Translation Patent Publication No. 2014-511626

SUMMARY

In an aspect of the present disclosure, a composite filter includes a common terminal, a first terminal, and a second terminal. The composite filter performs at least one of a process of simultaneously inputting two signals having different frequencies within a first passband to the first terminal and a process of simultaneously inputting two signals having different frequencies within a second passband to the second terminal. The composite filter includes a first filter system connecting the common terminal and the first terminal to each other and a second filter system connecting the common terminal and the second terminal to each other. The first filter system and the second filter system share a first 90° hybrid coupler connected to the common terminal. The first 90° hybrid coupler includes a first port, a second port, a third port, and a fourth port. The third port is electrically connected to the first port and the second port. The fourth port is electrically connected to the first port and the second port. The fourth port is a port to which a signal with a phase shifted by 90° relative to a phase of a signal distributed from the first port to the third port is distributed from the first port. The first port is connected to the common terminal. The first filter system includes a first filter, a second filter, and a second 90° hybrid coupler. The first filter is connected to the third port and corresponds to the first passband. The second filter is connected to the fourth port and corresponds to the first passband. The second 90° hybrid coupler connects the first filter and the second filter to the first terminal. The second 90° hybrid coupler includes a fifth port, a sixth port, a seventh port, and an eighth port. The seventh port is electrically connected to the fifth port and the sixth port. The eighth port is electrically connected to the fifth port and the sixth port. The eighth port is a port to which a signal with a phase shifted by 90° relative to a phase of a signal distributed from the fifth port to the seventh port is distributed from the fifth port. The fifth port is connected to the first filter. The sixth port is connected to the second filter. The eighth port is connected to the first terminal. The second filter system electrically connects the third port and the fourth port to the second terminal and relatively shifts a phase of a signal flowing from the third port toward the second terminal by 90° relative to a phase of a signal flowing from the fourth port toward the second terminal to change a phase difference between the two signals by 90°.

In an aspect of the present disclosure, a communication device includes the aforementioned composite filter, an antenna connected to the common terminal, and an integrated circuit element. The integrated circuit element connects the first terminal and the second terminal to each other and performs at least one of the process of simultaneously inputting two signals having different frequencies within the first passband to the first terminal and the process of simultaneously inputting two signals having different frequencies within the second passband to the second terminal.

DESCRIPTION OF EMBODIMENTS

Embodiments according to the present disclosure will be described below with reference to the drawings. The drawings to be used in the following description are schematic. Therefore, for example, the dimensional ratios in each drawing do not necessarily match those in actuality.

After describing a first embodiment, only the differences from the previously-described embodiment or embodiments will basically be described. Matters not particularly mentioned may be the same as and/or similar to those in the previously-described embodiment or embodiments, or may be assumed from the previously-described embodiment or embodiments.

In the present disclosure, the expression "phase is shifted" may imply that the phase is advanced and/or delayed. However, for the sake of convenience, the expression "phase is shifted" used when designating the shift amount has the meaning of either one of the two. For example, when the expression "phase is shifted by 90°" is used for explaining the function of multiple elements (e.g., 90° hybrid couplers) within a single composite filter, the multiple elements each have a function for advancing the phase by 90° or a function for delaying the phase by 90°. For example, when each element includes two terminals and the phase of a signal flowing from one of the terminals to the other terminal and the phase of a signal flowing from the other terminal to the one terminal are to be shifted by 90°, the phases of the two signals are both advanced by 90° or delayed by 90°.

First Embodiment (General Overview of Splitter)

Figure 1:
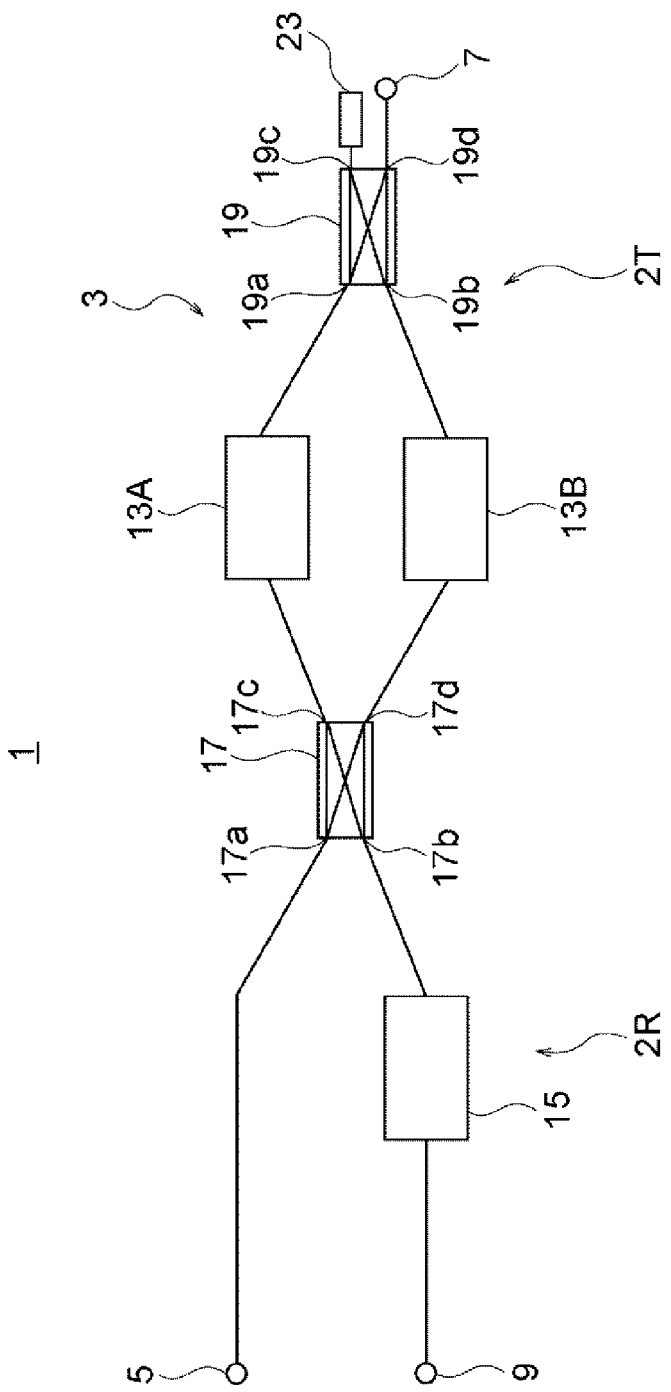
FIG. 1 is a circuit diagram illustrating the configuration of a splitter according to a first embodiment.

FIG. 1 is a circuit diagram illustrating the configuration of a splitter 1 serving as a composite filter according to a first embodiment.

More specifically, the splitter 1 serves as a duplexer. For example, the splitter 1 includes a transmission filter system 2T that filters a transmission signal from a transmission terminal 7 and outputs the transmission signal to an antenna terminal 5, and a reception filter system 2R that filters a reception signal from the antenna terminal 5 and outputs the reception signal to a reception terminal 9.

The transmission filter system 2T includes transmission filters 13A and 13B (sometimes hereinafter referred to as "transmission filters 13" collectively or without distinguishing the two from each other) that are directly responsible for filtering the transmission signal. The reception filter system 2R includes a reception filter 15 that is directly responsible for filtering the reception signal. Each transmission filter 13 corresponds to a transmission band. The reception filter 15 corresponds to a reception band. In other words, each transmission filter 13 and the reception filter 15 have passbands that are different from (i.e., do not overlap) each other. In the splitter 1, a part that includes the transmission filters 13 and the reception filter 15 and that directly contributes to filtering may sometimes be referred to as a splitter unit 3.

In the transmission filters 13 and/or the reception filter 15, a nonlinear distortion (distortion signal), such as an inter-modulation distortion (IMD), is known to occur due to nonlinearity of the transmission filters 13 and/or the reception filter 15. In the present disclosure, an inter-modulation distortion has a broad meaning including a passive inter-modulation (PIM), unless otherwise noted. This nonlinear distortion deteriorates the properties of the splitter 1. More specifically, for example, when a frequency of a nonlinear distortion in each transmission filter 13 is located within the passband of the reception filter 15, the nonlinear distortion passes through the reception filter 15 and enters the reception terminal 9, thus lowering the reception sensitivity.

The splitter 1 includes 90° hybrid couplers 17 and 19 ("90°" may sometimes be omitted hereinafter). The hybrid couplers 17 and 19 perform distribution, phase adjustment, and/or synthesis on the transmission signal and/or the reception signal. In this process, for example, the nonlinear distortion is distributed, and the distributed nonlinear distortions are given opposite phases and are subsequently synthesized, thereby cancelling each other out. In other words, the nonlinear distortion is reduced. In detail, in this embodiment, for example, PIM is reduced. On the other hand, the splitter 1 basically maintains the intensities of the transmission signal and the reception signal.

The transmission filter system 2T and the reception filter system 2R share the hybrid coupler 17. The hybrid coupler 17 is connected to the antenna terminal 5. In the hybrid coupler 17, the transmission filter system 2T and the reception filter system 2R branch off from each other.

The transmission filter system 2T includes the hybrid coupler 19 connected to the transmission terminal 7. A signal path from the transmission terminal 7 toward the antenna terminal 5 bifurcates at the hybrid coupler 19. The transmission filter 13A is located in one of the paths, and the transmission filter 13B is located in the other path. The transmission filters 13A and 13B correspond to the same passband. The transmission filters 13A and 13B are located between the hybrid coupler 19 and the hybrid coupler 17. An unused port 19c of the hybrid coupler 19 is connected to a termination resistor 23.

The reception filter system 2R includes the reception filter 15, as mentioned above. The reception filter 15 is located between the hybrid coupler 17 and the reception terminal 9.

(Filters)

Each of the transmission filters 13 is a bandpass filter with a predetermined transmission band as a passband. Likewise, the reception filter 15 is a bandpass filter with a predetermined reception band as a passband. The transmission band and the reception band may be compliant with, for example, various kinds of standards. The transmission band may include two or more transmission bands compliant with a predetermined standard. The same applies to the reception band.

The transmission filters 13A and 13B correspond to the same transmission band. In other words, the passbands of the transmission filters 13A and 13B are identical to each other substantially and/or in design. The transmission filters 13A and 13B are identical or similar to each other and have identical properties substantially or in design. Alternatively, the transmission filters 13A and 13B may be finely adjusted to have slightly different passbands and/or slightly different properties.

The transmission filters 13 and the reception filter 15 may each have, for example, a known configuration or an advanced version of the known configuration. For example, the transmission filters 13 and/or the reception filter 15 may each be a piezoelectric filter including a piezoelectric member, a dielectric filter that utilizes an electromagnetic wave within a dielectric member, an LC filter having a combination of an inductor and a capacitor, or a combination of two or more of these filters. Examples of a piezoelectric filter include a type that utilizes an elastic wave and a type that does not utilize an elastic wave (e.g., a type that uses a piezoelectric vibrator). An elastic wave is, for example, SAW (surface acoustic wave), BAW (bulk acoustic wave), a boundary elastic wave, or a Lamb wave (although these elastic waves are not necessarily distinguishable).

(90° Hybrid Coupler)

As is commonly known, the hybrid coupler 17 includes four ports 17a to 17d provided for receiving and/or outputting signals, and functions as a distributor, a synthesizer, and a 90° phase shifter. The hybrid coupler 17 may have, for example, a known configuration or an advanced version of the known configuration. For example, although not illustrated, the hybrid coupler 17 may be of a distributed constant type or a concentrated constant type. A well-known type of the hybrid coupler 17 is a branch-line coupler.

Figure 2A:
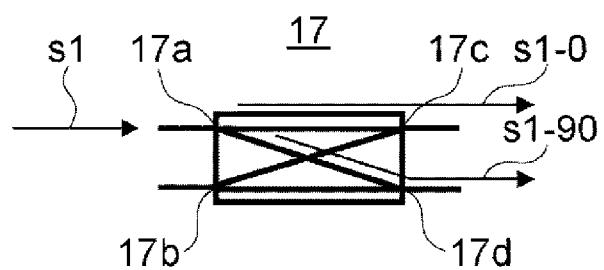
FIG. 2A is a schematic diagram illustrating an example of the operation of a 90° hybrid coupler.
Figure 2B:
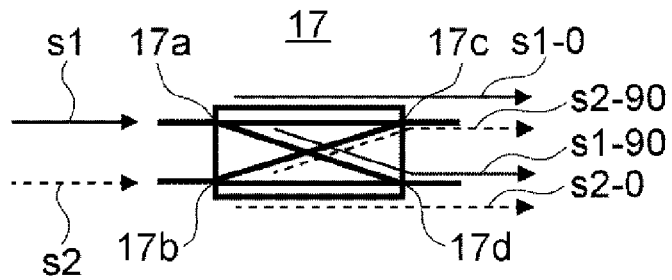
FIG. 2B is a schematic diagram illustrating another example of the operation of the 90° hybrid coupler.

FIG. 2A is a schematic diagram illustrating an example of the operation of the hybrid coupler 17. FIG. 2B is a schematic diagram illustrating another example of the operation of the hybrid coupler 17.

In each of the illustrated examples, the ports 17a and 17b at the left side of the drawing are electrically connected to the ports 17c and 17d at the right side of the drawing. The expression "electrically connected" implies that a signal is allowed to flow. Therefore, for example, as illustrated in FIG. 2A, a signal input to the port 17a is outputtable from the ports 17c and 17d.

For the sake of convenience, this embodiment may sometimes be described based on the positional relationship of the ports 17a to 17d in the diagram illustrating the hybrid coupler 17. However, the positional relationship of the four ports 17a to 17d in the diagram does not necessarily need to match the positional relationship of the four ports 17a to 17d in actuality.

As illustrated in FIG. 2A, a signal s1 input to the port 17a at the left side of the drawing is distributed to the ports 17c and 17d at the right side of the drawing so as to be output as signals s1-0 and s1-90. The distribution ratio in this case (i.e., the ratio between the intensity of the signal s1-0 and the intensity of the signal s1-90) is 1:1. The intensity is, for example, the voltage, current, and/or power. The phase of the signal s1-0 is, for example, the same as the phase of the signal s1. On the other hand, the phase of the signal s-90 has been, for example, shifted by 90° relative to the phase of the signal s1-0.

Although the same applies thereinafter, there may be a fixed phase difference between the signal s1 prior to the distribution and the signals s1-0 and s1-90 after the distribution. The fact that the phase of the signal s1-0 and the phase of the signal s1-90 have been shifted by 90° is the essence of a 90° hybrid coupler. For the sake of convenience, this embodiment may sometimes be described as if the signal s1 prior to the distribution and the signal s1-0 after the distribution have the same phase.

The above operation is similarly performed in a case where a signal is input to each of the other ports 17b to 17d. In other words, a signal input to one of the two ports located at one of the left and right sides of the drawing is distributed at the distribution ratio of 1:1 and output from the two ports located at the other one of the left and right sides of the drawing. In this case, the phase of the signal output from the port located at the opposite side, in the up-down direction of the drawing, of the port that has received the signal is shifted by 90° relative to the phase of the signal output from the port located at the same side, in the up-down direction of the drawing, as the port that has received the signal.

Since a device that operates in the above-described manner is called a 90° hybrid coupler, the relationship of the four ports of the hybrid coupler 17 is identifiable simply from a description related to one or more of the ports. For example, it is assumed that the port 17d is a port to which a signal with a phase shifted by 90° relative to the phase of a signal distributed from the port 17a to the port 17c is distributed from the port 17a. It is derived from this description that the port 17a and the remaining port 17b are located at the same side in the left-right direction of the drawing, the port 17c and the port 17d are located at the opposite side thereof, the port 17a and the port 17c are located at the same side in the up-down direction of the drawing, and the port 17b and the port 17d are located at the opposite side thereof. When the relationship of the four ports is described in accordance with the signal distributed from the port 17a, as in the above description, the hybrid coupler 17 does not need to be provided such as to actually receive a signal via the port 17a.

As illustrated in FIG. 2B, when the signal s1 is input to the port 17a at the left side of the drawing and a signal s2 is simultaneously input to the port 17b at the left side of the drawing, the signals s1 and s2 are distributed, as described above, and the distributed signals are synthesized. For example, the port 17c outputs a signal obtained as a result of synthesizing the signal s1-0 split from the signal s1 and having the same phase as the phase of the signal s1 and a signal s2-90 split from the signal s2 and having a phase shifted by 90° from the phase of the signal s2. The port 17d outputs a signal obtained as a result of synthesizing the signal s1-90 split from the signal s1 and having a phase shifted by 90° from the phase of the signal s1 and a signal s2-0 split from the signal s2 and having the same phase as the phase of the signal s2. Although the above description relates to a case where the two ports 17a and 17b at the left side of the drawing receive signals, the same applies to a case where the two ports 17c and 17d at the right side of the drawing receive signals.

As mentioned above, there may be a phase difference between the signal s1 and the signal s1-0 and a phase difference between the signal s2 and the signal s2-0. In this case, the two phase differences are the same. Two phase differences in a case where signals are oriented in opposite directions are also the same as the aforementioned two phase differences. From another viewpoint, for example, the hybrid coupler 17 is configured such that the phase of the signal s2-90 flowing from the port 17b toward the port 17c is relatively shifted by 90° relative to the phase of the signal s1-0 flowing from the port 17a toward the port 17c and that the phase difference between the two signals changes by 90° (i.e., the phase difference between the signals s1 and s2 and the phase difference between the signals s1-0 and s2-90 are different from each other by 90°). The expression "relatively shifted by 90°" may imply that the phases of the signals prior to the shift (i.e., the phase of the signal s1 and the phase of the signal s2) do not match.

Although the hybrid coupler 17 has been described above, the above description may be applied to the hybrid coupler 19 by replacing 17 and 17a to 17d with 19 and 19a to 19d, respectively.

Referring back to FIG. 1, in the hybrid coupler 17, the port 17a is connected to the antenna terminal 5. The port 17b is connected to the reception filter 15. The port 17c is connected to the transmission filter 13A. The port 17d is connected to the transmission filter 13B.

In the hybrid coupler 19, the port 19a is connected to the transmission filter 13A. The port 19b is connected to transmission filter 13B. The port 19c is connected to the termination resistor 23, as mentioned above. The port 19d is connected to the transmission terminal 7.

(Termination Resistor)

The termination resistor 23 has, for example, a predetermined resistance value and connects the port 19c of the hybrid coupler 19 to a reference potential section (not illustrated). Accordingly, for example, reflection of a signal flowing from the port 19a and/or the port 19b toward the port 19c is reduced. The resistance value of the termination resistor 23 may be appropriately set in accordance with the impedance at the hybrid coupler 19 than the termination resistor 23, and is normally 50Ω. The termination resistor 23 may have a known configuration or an advanced version of the known configuration. For example, although not particularly illustrated, the termination resistor 23 may be an electronic component mounted on a circuit substrate or may be a conductive pattern formed on a circuit substrate.

(Operation of Composite Filter)

Figure 3A:
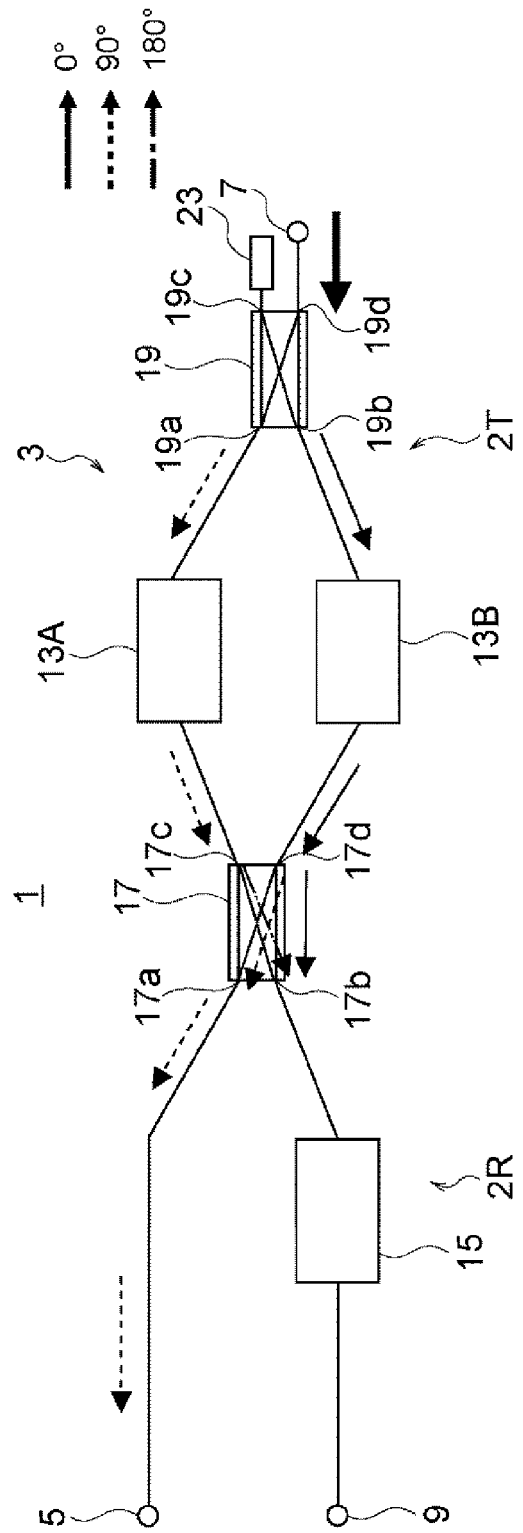
FIG. 3A is a schematic diagram illustrating the operation of the splitter when one signal is input to a transmission terminal.

FIG. 3A illustrates the operation of the splitter 1 when a signal (e.g., the transmission signal) is input to the transmission terminal 7. In this drawing, the flow of the signal is indicated by arrows. As indicated by explanatory legends at the right side of the drawing, the line types of the arrows are varied in accordance with changes in the phase of the signal. The phase of the signal when flowing through the transmission terminal 7 is 0°.

The signal input from the transmission terminal 7 to the port 19d of the hybrid coupler 19 is distributed to the ports 19a and 19b. A signal with a phase of 90° is output from the port 19a, and the signal is input to the port 17c of the hybrid coupler 17 after passing through the transmission filter 13A. A signal with a phase of 0° is output from the port 19b, and the signal is input to the port 17d of the hybrid coupler 17 after passing through the transmission filter 13B.

The signal with the phase of 90° input to the port 17c is distributed to the port 17a while the phase is maintained. On the other hand, the signal with the phase of 0° input to the port 17d is phase-shifted by 90° before being distributed to the port 17a. Therefore, the two signals distributed to the port 17a have the same phase (90°) and are synthesized before being output to the antenna terminal 5.

The signal with the phase of 90° input to the port 17c is phase-shifted by 90° (i.e., is turned into a signal with a phase of 180°) before being distributed to the port 17b. On the other hand, the signal with the phase of 0° input to the port 17d is distributed to the port 17b while the phase is maintained. Therefore, the two signals distributed to the port 17b have opposite phases (0° and 180°) from each other and cancel each other out. In other words, no signal is output to the reception filter 15.

Accordingly, the signal input from the transmission terminal 7 is output to the antenna terminal 5, but is not output to the reception filter 15 (reception terminal 9). Although the above expression indicates that the two signals input to the ports 17c and 17d are distributed to the port 17b for the sake of convenience, the fact that no signal is output from the port 17b substantially implies that no signal is distributed to the port 17b. In other words, if an insertion loss is neglected, the intensity of the signal output from the antenna terminal 5 is equal to the intensity of the signal input to the transmission terminal 7.

Figure 3B:
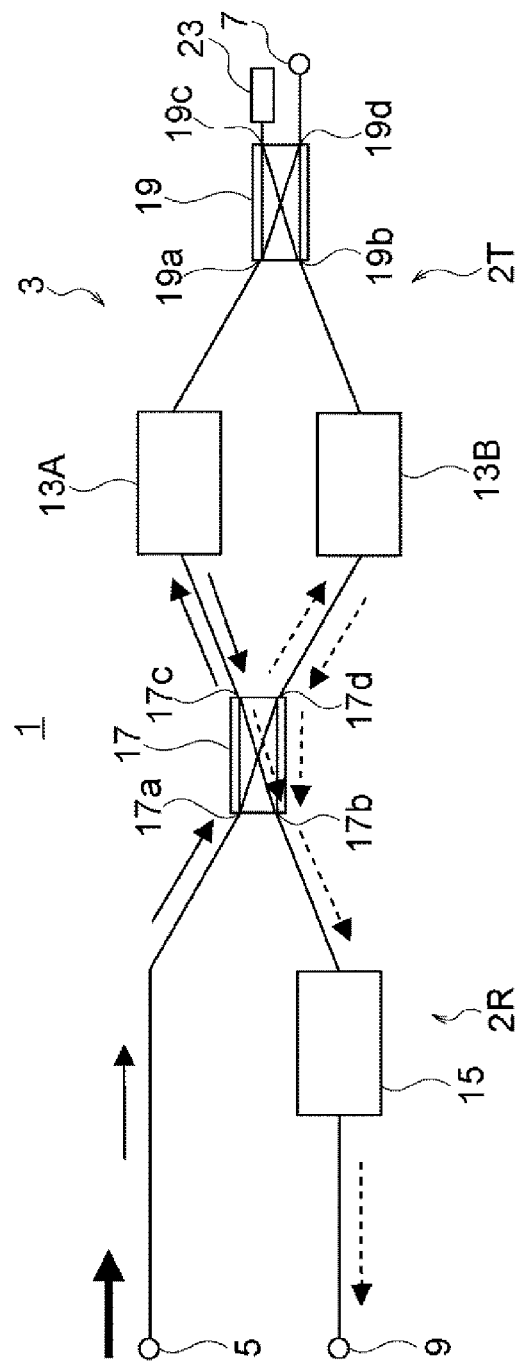
FIG. 3B is a schematic diagram illustrating the operation of the splitter when one signal is input to an antenna terminal.

FIG. 3B illustrates the operation of the splitter 1 when a signal (e.g., the reception signal) is input to the antenna terminal 5. In this drawing, the flow of the signal input to the antenna terminal 5 is indicated by arrows. The line types of the arrows are varied in accordance with changes in the phase of the signal, as in FIG. 3A (see the explanatory legends in FIG. 3A). The phase of the signal when flowing through the antenna terminal 5 is 0°.

The signal input from the antenna terminal 5 to the port 17a of the hybrid coupler 17 is distributed to the ports 17c and 17d. A signal with a phase of 0° flows from the port 17c to the transmission filter 13A. A signal with a phase of 90° flows from the port 17d to the transmission filter 13B. Signals (e.g., reception signals) outside the passbands of the transmission filters 13A and 13B are reflected by the transmission filters 13A and 13B so as to return to the ports 17c and 17d.

The signal with the phase of 0° reflected by the transmission filter 13A and input to the port 17c is phase-shifted by 90° before being distributed to the port 17b. On the other hand, the signal with the phase of 90° reflected by the transmission filter 13B and input to the port 17d is distributed to the port 17b while the phase is maintained. Therefore, the two signals distributed to the port 17b have the same phase (90°) and are synthesized before being input to the reception filter 15, and by extension, output to the reception terminal 9.

The signal with the phase of 0° reflected by the transmission filter 13A and input to the port 17c is distributed to the port 17a while the phase is maintained. On the other hand, the signal with the phase of 90° reflected by the transmission filter 13B and input to the port 17d is phase-shifted by 90° (i.e., is turned into a signal with a phase of 180°) before being distributed to the port 17a. Therefore, the two signals distributed to the port 17a have opposite phases (0° and 180°) from each other and cancel each other out. In other words, no signal is output to the antenna terminal 5.

Accordingly, the signal (i.e., the reception signal) input from the antenna terminal 5 is output to the reception terminal 9, but is not output to the transmission terminal 7 and does not return to the antenna terminal 5. Although the above expression indicates that the two signals input to the ports 17c and 17d are distributed to the port 17a for the sake of convenience, the fact that no signal is output from the port 17a substantially implies that no signal is distributed to the port 17a. In other words, if an insertion loss is neglected, the intensity of the signal output to the reception terminal 9 is equal to the intensity of the signal input to the antenna terminal 5.

(Nonlinear Distortion)

The elements constituting the transmission filters 13 and the reception filter 15 may sometimes have nonlinearity. For example, in a piezoelectric filter, the relationship between stress applied to the piezoelectric member and a distortion (not a nonlinear distortion but a ratio of deformation amounts) occurring in the piezoelectric member is ideally linear. However, when the stress reaches a certain magnitude, a distortion is less likely to occur and further becomes saturated. In other words, the piezoelectric member has nonlinear properties in which an input and a response are not proportional to each other. As a result, when a filter receives one signal or two or more signals with relatively large electric power, a nonlinear distortion (distortion signal) occurs.

For example, it is assumed that the frequencies of two signals (input voltages) input to a filter are defined as f1 and f2, respectively, and m and n are integers ( . . . , −3, −2. −1, 0, 1, 2, 3, . . . ). In this case, a signal having a frequency of m×f1+n×f2 (i.e., an output voltage and an output current from another viewpoint) is generated in the filter. |m|+|n| is called an order. A signal in which |m|+|n| is equal to or greater than 2 is a nonlinear distortion. A signal in which both m and n are not 0 is an inter-modulation distortion. A signal in which one of m and n is 0 is a harmonic.

Examples of two signals that generate a nonlinear distortion include various signals. One example includes two transmission signals simultaneously input to the transmission terminal 7 in the splitter 1 shared in two or more frequency bands at a base station and/or the like. Other examples include an interference wave (noise) from the antenna terminal 5 and a transmission signal input to the transmission terminal 7.

When the term "nonlinear distortion" is simply used in the description of this embodiment, the values of m and n are arbitrary, unless otherwise noted. For example, the nonlinear distortion may be a third-order nonlinear distortion in which m=2 and n=−1, a third-order nonlinear distortion in which m=2 and n=1, an odd-numbered-order nonlinear distortion, or an even-numbered-order nonlinear distortion. Of these nonlinear distortions, the composite filter according to this embodiment can reduce the possibility in which a nonlinear distortion with |m+n|=1 flows toward the reception filter 15. Examples of the nonlinear distortion with |m+n|=1 include odd-numbered-order inter-modulation distortions, such as a third-order inter-modulation distortion (m=2, n=−1) and a fifth-order inter-modulation distortion (m=3, n=−2).

Figure 4A:
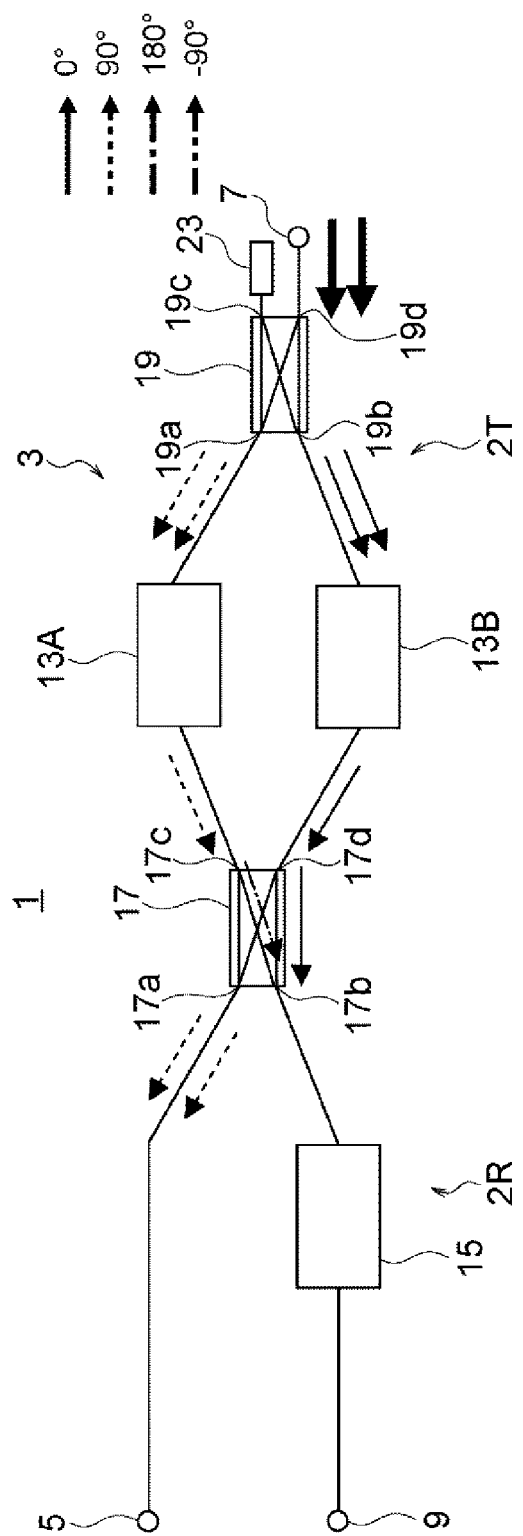
FIG. 4A is another schematic diagram illustrating the operation of the splitter when two signals are input to the transmission terminal.

FIG. 4A illustrates the operation of the splitter 1 when a nonlinear distortion (e.g., PIM) occurs in each of the transmission filters 13 as a result of two signals (e.g., two transmission signals having frequencies within the passbands of the transmission filters 13) with different frequencies being simultaneously input to the transmission terminal 7. In this drawing, the flow of each signal is indicated by arrows. The line types of the arrows are varied in accordance with changes in the phase of each signal, as in FIG. 3A. The phase of each signal when flowing through the transmission terminal 7 is 0°.

In a signal path from the transmission terminal 7 to each of the transmission filters 13A and 13B, arrows are drawn parallel to each other to indicate that the two signals having different frequencies are flowing through the signal path. It is clear from the line types of the arrows that the two signals are phase-shifted by 90° by the hybrid coupler 19 and are distributed to the transmission filters 13A and 13B, similarly to the signals described with reference to FIG. 3A. Each transmission filter 13 receives the two signals having different frequencies, so that a nonlinear distortion occurs. The nonlinear distortion partially flows from each transmission filter 13 to the hybrid coupler 17.

At the hybrid coupler 17 side from the transmission filters 13A and 13B, the flow of the aforementioned nonlinear distortion is indicated by an arrow. As mentioned above, the two signals with the different frequencies input to the transmission terminal 7 are phase-shifted by 90° before being distributed to the two transmission filters 13. Assuming that the phases of the two signals input to the filters are $\varphi 1$ and $\varphi 2$, respectively, the phase of the nonlinear distortion that is to occur is calculated from $m \times \varphi 1 + n \times \varphi 2$, which is the same expression used for the frequency indicated above. Assuming that $\varphi 1 = \varphi 2 = 90°$, the phase of the nonlinear distortion that is to occur is $m \times 90° + n \times 90° = (m+n) \times 90°$, whereby 90° when |m+n|=1. As a result, the nonlinear distortion occurring in the transmission filter 13A and the nonlinear distortion occurring in the transmission filter 13B have phases shifted by 90° relative to each other.

The two nonlinear distortions with the aforementioned phases shifted by 90° relative to each other and flowing through the hybrid coupler 17 are processed similarly to the two signals flowing from the two transmission filters 13 to the hybrid coupler 17 in FIG. 3A. In other words, the two nonlinear distortions are output from the hybrid coupler 17 to the antenna terminal 5 but are not output to the reception filter 15 (reception terminal 9). Accordingly, the nonlinear distortions occurring in the transmission filters 13 due to the two signals input to the transmission terminal 7 are not output to the reception terminal 9.

Figure 4B:
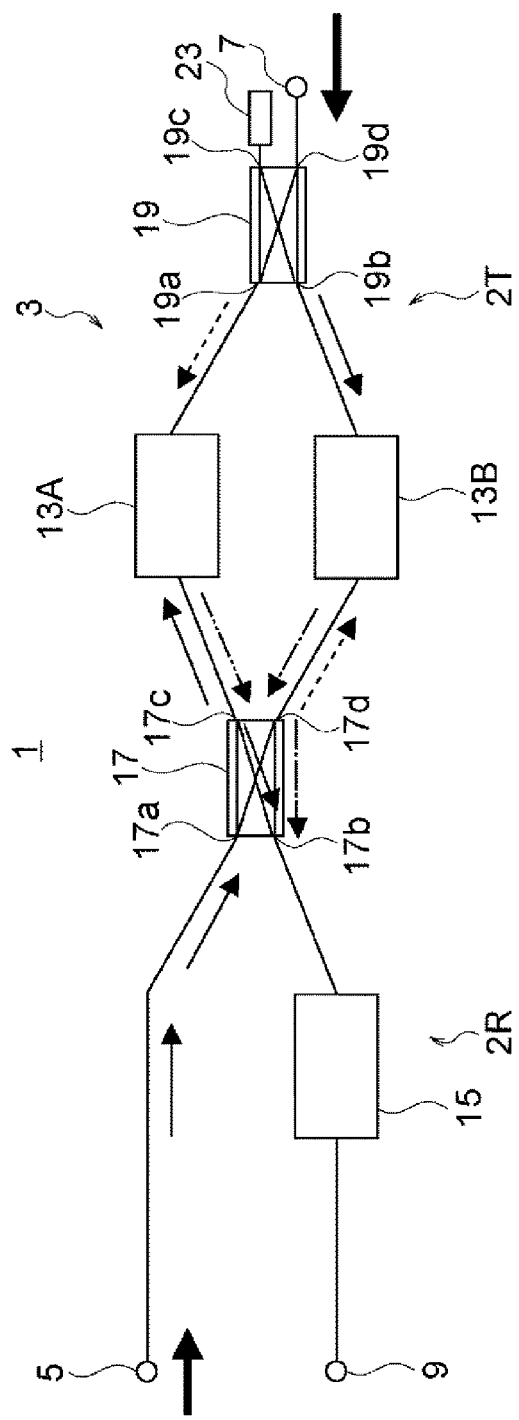
FIG. 4B is another schematic diagram illustrating the operation of the splitter when signals are input to the transmission terminal and the antenna terminal.

FIG. 4B illustrates the operation of the splitter 1 when a nonlinear distortion occurs in each of the transmission filters 13 as a result of a signal (e.g., a transmission signal) being input to the transmission terminal 7 and a signal (e.g., an interference wave) being input to the antenna terminal 5. In this drawing, the flow of the signals is indicated by arrows. The line types of the arrows are varied in accordance with changes in the phase of each signal, as in FIG. 4A (see the explanatory legends in FIG. 4A). With regard to the signal input to the transmission terminal 7, the phase of the signal when flowing through the transmission terminal 7 is 0°. With regard to the signal input to the antenna terminal 5, the phase of the signal when flowing through the antenna terminal 5 is 0°.

The arrows oriented toward the transmission filters 13A and 13B from the transmission terminal 7 via the hybrid coupler 19 indicate the flow of the signal input to the transmission terminal 7. As described with reference to FIG. 3A, the signal input to the transmission terminal 7 is phase-shifted by 90° before being distributed to the transmission filters 13A and 13B.

The arrows oriented toward the transmission filters 13A and 13B from the antenna terminal 5 via the hybrid coupler 17 indicate the flow of the signal input to the antenna terminal 5. As described with reference to FIG. 3B, the signal input to the antenna terminal 5 is phase-shifted by 90° before being distributed to the transmission filters 13A and 13B.

Therefore, each transmission filter 13 receives the two signals having different frequencies (i.e., the signal from the transmission terminal 7 and the signal from the antenna terminal 5), so that a nonlinear distortion occurs. The nonlinear distortion partially flows from each transmission filter 13 to the hybrid coupler 17.

The following focuses on a nonlinear distortion in which m=2 and n=−1 (i.e., a third-order nonlinear distortion having a frequency of 2×f1−f2), assuming that the frequency of the signal input to the antenna terminal 5 is defined as f1 and the frequency of the signal input to the transmission terminal 7 is defined as f2. The arrows oriented toward the hybrid coupler 17 from the transmission filters 13A and 13B indicate the flow of this third-order nonlinear distortion.

The transmission filter 13A receives a signal with a phase of 0° from the antenna terminal 5 and a signal with a phase of 90° from the transmission terminal 7. Therefore, the phase of the nonlinear distortion having the frequency of 2×f1−f2 is 2×0°−90°=−90°. On the other hand, the transmission filter 13B receives a signal with a phase of 90° from the antenna terminal 5 and a signal with a phase of 0° from the transmission terminal 7. Therefore, the phase of the nonlinear distortion having the frequency of 2×f1−f2 is 2×90°−0°=180°.

The nonlinear distortion with the phase of −90° generated by the transmission filter 13A and input to the port 17c of the hybrid coupler 17 is phase-shifted by 90° (i.e., is turned into a nonlinear distortion with a phase of 0°) before being distributed to the port 17b. On the other hand, the nonlinear distortion with the phase of 180° generated by the transmission filter 13B and input to the port 17d of the hybrid coupler 17 is distributed to the port 17b while the phase is maintained. Therefore, the two nonlinear distortions distributed to the port 17b have opposite phases (0° and 180°) from each other and cancel each other out. In other words, the nonlinear distortions are not input to the reception filter 15, and by extension, not output to the reception terminal 9.

Accordingly, in this embodiment, the composite filter (splitter 1) includes a common terminal (antenna terminal 5), a first terminal (transmission terminal 7), and a second terminal (reception terminal 9). In the splitter 1, two signals having different frequencies within a first passband (transmission band) are simultaneously input to the transmission terminal 7. The splitter 1 includes a first filter system (transmission filter system 2T) that connects the antenna terminal 5 and the transmission terminal 7 to each other and a second filter system (reception filter system 2R) that connects the antenna terminal 5 and the reception terminal 9 to each other. The transmission filter system 2T and the reception filter system 2R share a first 90° hybrid coupler (hybrid coupler 17) connected to the antenna terminal 5. The hybrid coupler 17 includes a first port (port 17a) and a second port (port 17b), a third port (port 17c) electrically connected to the ports 17a and 17b, and a fourth port (port 17d) electrically connected to the ports 17a and 17b. The port 17d is a port to which a signal with a phase shifted by 90° relative to the phase of a signal distributed from the port 17a to the port 17c is distributed from the port 17a. The port 17a is connected to the antenna terminal 5. The transmission filter system 2T includes a first filter (transmission filter 13A), a second filter (transmission filter 13B), and a second 90° hybrid coupler (hybrid coupler 19). The transmission filter 13A is connected to the port 17c and corresponds to the transmission band. The transmission filter 13B is connected to the port 17d and corresponds to the transmission band. The hybrid coupler 19 connects the transmission filters 13A and 13B to the transmission terminal 7. The hybrid coupler 19 includes a fifth port and a sixth port (ports 19a and 19b), a seventh port (port 19c) electrically connected to the ports 19a and 19b, and an eighth port (port 19d) electrically connected to the ports 19a and 19b. The port 19d is a port to which a signal with a phase shifted by 90° relative to the phase of a signal distributed from the port 19a to the port 19c is distributed from the port 19a. The port 19a is connected to the transmission filter 13A. The port 19b is connected to the transmission filter 13B. The port 19d is connected to the transmission terminal. The reception filter system 2R (more specifically, the hybrid coupler 17 shared with the transmission filter system 2T) electrically connects the port 17c and the port 17d to the reception terminal 9 (i.e., the port 17b from another viewpoint) such that the phase of a signal flowing from the port 17c to the reception terminal 9 is relatively shifted by 90° relative to the phase of a signal flowing from the port 17d to the reception terminal 9 and that the phase difference between the two signals changes by 90°.

Therefore, for example, as described above with reference to FIG. 4A, the two nonlinear distortions occurring in the two transmission filters 13 due to the two transmission signals input simultaneously to the transmission terminal cancel each other out in the hybrid coupler 17, so that the nonlinear distortions to be input to the reception filter 15 are reduced (i.e., eliminated in theory). As a result, the splitter 1 can have improved reception sensitivity.

The reception filter system 2R may include a third filter (reception filter 15). The reception filter 15 corresponds to a second passband (reception band) different from the first passband (transmission band), and may connect the port 17b of the hybrid coupler 17 and the reception terminal 9 to each other.

In this case, for example, the reception filter system 2R has a simple configuration, as compared with a third embodiment to be described later. From another viewpoint, size reduction can be readily achieved. Furthermore, for example, in the case where the first filter system is the transmission filter system 2T and the second filter system is the reception filter system 2R, as in this embodiment, power durability can be enhanced while achieving a simplified configuration and/or size reduction, as mentioned above. Details are as follows. In the first filter system (i.e., the transmission filter system 2T in this embodiment), a signal input to the first terminal (i.e., the transmission terminal 7 in this embodiment) is distributed by the hybrid coupler 19 so as to be input to the first filter and the second filter (i.e., the transmission filters 13A and 13B in this embodiment). Thus, the electric power input to each of the first filter and the second filter is reduced. On the other hand, the intensity of the transmission signal input to the transmission terminal 7 is normally higher than the intensity of the reception signal input from the antenna terminal 5. Therefore, the transmission filter system 2T is provided with two transmission filters 13, and the reception filter system 2R is provided with one reception filter 15, thereby enhancing power durability while achieving a simplified configuration and/or size reduction.

The composite filter (splitter 1) may include the termination resistor 23 connected to the seventh port (port 19c).

In this case, for example, a reflection loss in the transmission filter system 2T can be reduced. From another viewpoint, a voltage standing wave ratio (VSWR) in the transmission terminal 7 can be reduced (i.e., can be reduced to 1, which is a minimum value, in theory). Details are as follows. As described above with reference to FIG. 3A, the signal input to the transmission terminal 7 is distributed to the transmission filters 13A and 13B by the hybrid coupler 19. The hybrid coupler 19 turns a signal reflected by the transmission filter 13A and flowing from the port 19a to the port 19d (i.e., the transmission terminal 7 from another viewpoint) into a signal having a phase difference of 180° relative to the signal input to the transmission terminal 7. On the other hand, a signal reflected by the transmission filter 13B and flowing from the port 19b to the port 19d maintains the same phase as the signal input to the transmission terminal 7. Therefore, the two signals cancel each other out. In other words, the signal input to the transmission terminal 7 does not return to the transmission terminal 7 even if the signal is partially reflected by the transmission filters 13A and 13B. The hybrid coupler 19 turns a signal reflected by the transmission filter 13A and flowing from the port 19a to the port 19c (i.e., the termination resistor 23 from another viewpoint) into a signal having a phase difference of 90° relative to the signal input to the transmission terminal 7. On the other hand, the hybrid coupler 19 also turns a signal reflected by the transmission filter 13B and flowing from the port 19b to the port 19c into a signal having a phase difference of 90° relative to the signal input to the transmission terminal 7. Therefore, these two signals are synthesized before being input to the termination resistor 23. Accordingly, a reflection wave is entirely input to the termination resistor 23 in theory. Thus, by properly setting the impedance of the termination resistor 23, a reflection wave returning to the transmission terminal 7 is reduced (i.e., eliminated in theory), so that VSWR in the transmission terminal 7 can be reduced. From another viewpoint, the necessity to enhance impedance matching between the transmission filters 13A and 13B is reduced, thereby enhancing the degree of design freedom in the transmission filters 13A and 13B.

In the first embodiment described above, the splitter 1 is an example of a composite filter. The antenna terminal 5 is an example of a common terminal. The transmission terminal 7 is an example of a first terminal. The reception terminal 9 is an example of a second terminal. The transmission filter system 2T is an example of a first filter system. The reception filter system 2R is an example of a second filter system. The transmission filter 13A is an example of a first filter. The transmission filter 13B is an example of a second filter. The reception filter 15 is an example of a third filter. The transmission band is an example of a first passband. The reception band is an example of a second passband. The hybrid coupler 17 is an example of a first hybrid coupler. The port 17a is an example of a first port. The port 17b is an example of a second port. The port 17c is an example of a third port. The port 17d is an example of a fourth port. The hybrid coupler 19 is an example of a second hybrid coupler. The port 19a is an example of a fifth port. The port 19b is an example of a sixth port. The port 19c is an example of a seventh port. The port 19d is an example of an eighth port.

Second Embodiment (Configuration of Splitter)

Figure 5:
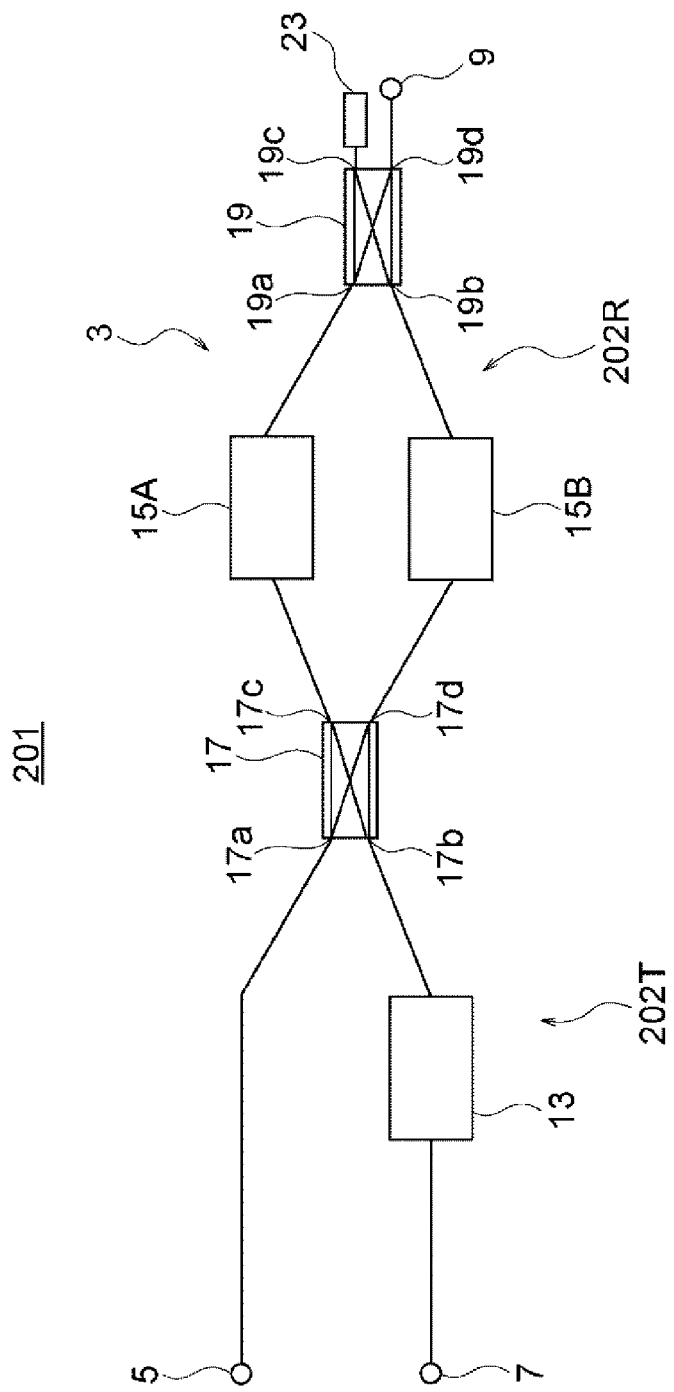
FIG. 5 is a circuit diagram illustrating the configuration of a splitter according to a second embodiment.

FIG. 5 is a circuit diagram illustrating the configuration of a splitter 201 serving as a composite filter according to a second embodiment.

Briefly speaking, the splitter 201 is obtained by interchanging the transmission filters 13 and the reception filter 15 with each other in the splitter 1 according to the first embodiment. Details are as follows.

A reception filter system 202R includes the hybrid coupler 17, two reception filters 15A and 15B (sometimes hereinafter referred to as "reception filters 15" collectively or without distinguishing the two from each other), the hybrid coupler 19, and the termination resistor 23 in that order from the antenna terminal 5 toward the reception terminal 9. With regard to the connection relationship among these components, the description of the connection relationship in the transmission filter system 2T according to the first embodiment may be used. However, the terms "transmission filters 13A and 13B (13)" are replaced with the terms "reception filters 15A and 15B (15)", and the term "transmission terminal 7" is replaced with the term "reception terminal 9".

The two reception filters 15 correspond to the same passband (but the reception band unlike the first embodiment), similarly to the two transmission filters 13 according to the first embodiment. With regard to the fact that the two reception filters 15 may have the same configuration and the same properties, the description of the two transmission filters 13 according to the first embodiment may be used.

A transmission filter system 202T includes a transmission filter 13 and a hybrid coupler 17 in that order from the transmission terminal 7 toward the antenna terminal 5. With regard to the connection relationship between these components, the description of the connection relationship in the reception filter system 2R according to the first embodiment may be used. However, the term "reception filter 15" is replaced with the term "transmission filter 13", and the term "reception terminal 9" is replaced with the term "transmission terminal 7".

(Operation of Splitter)

The operation of the splitter 201 is as follows.

First, the operation of the splitter 1 when a signal (e.g., a transmission signal) is input to the transmission terminal 7 will be described. In the following description, the phase of the signal when flowing through the transmission terminal 7 is 0°.

The signal input from the transmission terminal 7 to the port 17b of the hybrid coupler 17 via the transmission filter 13 is distributed to the port 17c and the port 17d. The signal output from the port 17c has a phase of 90° and is reflected by the reception filter 15A so as to return to the port 17c. The signal output from the port 17d has a phase of 0° and is reflected by the reception filter 15B so as to return to the port 17d.

In FIG. 3A, the signal with the phase of 90° is input to the port 17c and the signal with the phase of 0° is input to the port 17d, similarly to the above description. Therefore, in this embodiment, the signal input to the transmission terminal 7 is output from the port 17a to the antenna terminal 5 and is not output from the port 17b, as in the first embodiment.

The operation of the splitter 1 when a signal (e.g., a reception signal) is input to the antenna terminal 5 will now be described. In the following description, the phase of the signal when flowing through the antenna terminal 5 is 0°.

The signal input from the antenna terminal 5 to the port 17a of the hybrid coupler 17 is distributed to the ports 17c and 17d. The signal output from the port 17c has a phase of 0° and is input to the port 19a of the hybrid coupler 19 via the reception filter 15A. The signal output from the port 17d has a phase of 90° and is input to the port 19b of the hybrid coupler 19 via the reception filter 15B.

A signal distributed to the port 19d (reception terminal 9) from the signal with the phase of 0° input to the port 19a is phase-shifted by 90°. A signal distributed to the port 19d from the signal with the phase of 90° input to the port 19b has its phase maintained at 90°. Therefore, the two signals have the same phase (90°) and are synthesized before being output from the port 19d to the reception terminal 9.

On the other hand, a signal distributed to the port 19c from the signal with the phase of 0° input to the port 19a has its phase maintained at 0°. A signal distributed to the port 19c from the signal with the phase of 90° input to the port 19b is phase-shifted by 90° so as to become a signal with a phase of 180°. Therefore, the two signals cancel each other out, so as not to be output from the port 19c.

Accordingly, the signal input from the antenna terminal 5 is output to each reception filter 15 (reception terminal 9) but is not output to the transmission filter 13 (transmission terminal 7) due to the function of the hybrid coupler 17. Although the above expression indicates that the signal input to the port 19a or 19b is distributed to the port 19c for the sake of convenience, the fact that no signal is output from the port 19c substantially implies that no signal is distributed to the port 19c. In other words, if an insertion loss is neglected, the intensity of the signal output to the reception terminal 9 is equal to the intensity of the signal input to the antenna terminal 5.

The operation of the splitter 1 when two signals are input to the transmission terminal 7 and a nonlinear distortion occurs in the transmission filter 13 will now be described. In the following description, it is assumed that the nonlinear distortion has a frequency within the reception band of each reception filter 15 and passes through the reception filter 15 without being reflected at the reception filter 15. The phase of the nonlinear distortion when flowing from the transmission filter 13 toward the port 17b of the hybrid coupler 17 is 0°.

The nonlinear distortion input to the port 17b from the transmission filter 13 is distributed to the port 17c and the port 17d. The nonlinear distortion output from the port 17c has a phase of 90° and is input to the port 19a of the hybrid coupler 19 via the reception filter 15A. The nonlinear distortion output from the port 17d has a phase of 0° and is input to the port 19b of the hybrid coupler 19 via the reception filter 15B.

A nonlinear distortion distributed to the port 19d (reception terminal 9) from the nonlinear distortion with the phase of 90° input to the port 19a is phase-shifted by 90° so as to become a nonlinear distortion with a phase of 180°. A nonlinear distortion distributed to the port 19d from the nonlinear distortion with the phase of 0° input to the port 19b has its phase maintained at 0°. Therefore, the two nonlinear distortions have opposite phases (180° and 0°) from each other and cancel each other out. In other words, no nonlinear distortion is output to the reception terminal 9.

On the other hand, a nonlinear distortion distributed to the port 19c from the nonlinear distortion with the phase of 90° input to the port 19a has its phase maintained at 90°. A nonlinear distortion distributed to the port 19c from the nonlinear distortion with the phase of 0° input to the port 19b is phase-shifted by 90° so as to become a nonlinear distortion with a phase of 90°. Therefore, the two nonlinear distortions have the same phase (90°) and are synthesized before being input to the termination resistor 23. In this embodiment, the transmission signal is reflected by each reception filter 15, so that the reception filter 15 also receives a strong transmission signal. Thus, a nonlinear distortion also occurs in each reception filter 15. However, the relationship of the phases of the nonlinear distortions occurring at the reception filter 15A and the reception filter 15B is the same as that of the nonlinear distortion occurring at the aforementioned transmission filter 13 and transmitted to each reception filter 15, so that the nonlinear distortions are absorbed by the termination resistor 23 based on the same and/or similar principle and are not input to the reception terminal 9.

Accordingly, in this embodiment, the composite filter (splitter 201) includes a common terminal (antenna terminal 5), a first terminal (reception terminal 9), and a second terminal (transmission terminal 7). In the splitter 1, two signals having different frequencies within a second passband (transmission band) different from a first passband (reception band) are simultaneously input to the transmission terminal 7. The splitter 1 includes a first filter system (reception filter system 202R) that connects the antenna terminal 5 and the reception terminal 9 to each other and a second filter system (transmission filter system 202T) that connects the antenna terminal 5 and the transmission terminal 7 to each other. The transmission filter system 202T and the reception filter system 202R share a first 90° hybrid coupler (hybrid coupler 17) connected to the antenna terminal 5. The port 17a is connected to the antenna terminal 5. The reception filter system 202R includes a first filter (reception filter 15A), a second filter (reception filter 15B), and a second 90° hybrid coupler (hybrid coupler 19). The reception filter 15A is connected to the port 17c and corresponds to the reception band. The reception filter 15B is connected to the port 17d and corresponds to the reception band. The hybrid coupler 19 connects the reception filters 15A and 15B to the reception terminal 9. The port 19a is connected to the reception filter 15A. The port 19b is connected to the reception filter 15B. The port 19d is connected to the reception terminal 9. The transmission filter system 202T (more specifically, the hybrid coupler 17 shared with the reception filter system 202R) electrically connects the port 17c and the port 17d to the transmission terminal 7 (i.e., the port 17b from another viewpoint) such that the phase of a signal flowing from the port 17c to the transmission terminal 7 is relatively shifted by 90° relative to the phase of a signal flowing from the port 17d to the transmission terminal 7 and that the phase difference between the two signals changes by 90°.

Therefore, it is clear from the operation described above that effects identical or similar to those in the first embodiment are exhibited. For example, a nonlinear distortion occurring in the transmission filter 13 and having a frequency within the reception band is distributed to the two reception filters 15A and 15B, and the nonlinear distortions cancel each other out in the hybrid coupler 19. In other words, the nonlinear distortions to be input to the reception terminal 9 are reduced (i.e., eliminated in theory). As a result, the splitter 1 can have improved reception sensitivity.

In the second embodiment described above, the splitter 201 is an example of a composite filter. The antenna terminal 5 is an example of a common terminal. The reception terminal 9 is an example of a first terminal. The transmission terminal 7 is an example of a second terminal. The reception filter system 202R is an example of a first filter system. The transmission filter system 202T is an example of a second filter system. The reception filter 15A is an example of a first filter. The reception filter 15B is an example of a second filter. The transmission filter 13 is an example of a third filter. The reception band is an example of a first passband. The transmission band is an example of a second passband. As in the first embodiment, the various types of ports of the hybrid couplers 17 and 19 are examples of a first port to an eighth port.

Third Embodiment (Configuration of Splitter)

Figure 6:
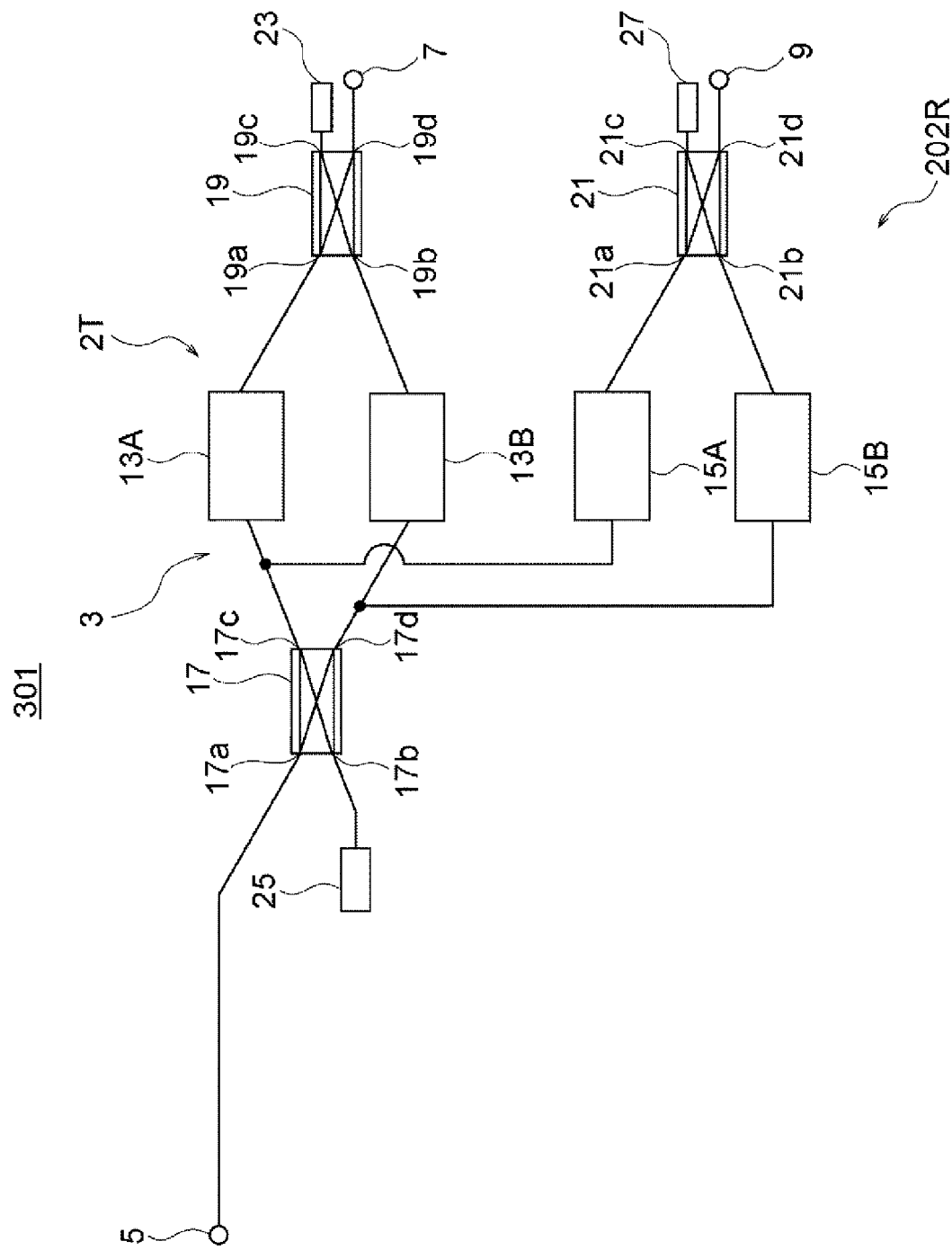
FIG. 6 is a circuit diagram illustrating the configuration of a splitter according to a third embodiment.

FIG. 6 is a circuit diagram illustrating the configuration of a splitter 301 serving as a composite filter according to a third embodiment.

Briefly speaking, the splitter 301 is a combination of the first embodiment and the second embodiment. It is clear from a comparison between FIG. 1 and FIG. 6 that, in the splitter 301, the transmission filter system 2T may be the same as that in the first embodiment. It is clear from a comparison between FIG. 5 and FIG. 6 that, in the splitter 301, the reception filter system 202R may be the same as that in the second embodiment.

As mentioned above, the reception filter system 202R may be the same as that in the second embodiment. However, for the sake of convenience, a hybrid coupler and a termination resistor included in the reception filter system 202R are given different reference signs from the second embodiment. In detail, in FIG. 6, a hybrid coupler 21 and ports 21a to 21d correspond to the hybrid coupler 19 and the ports 19a to 19d in FIG. 5. In FIG. 6, a termination resistor 27 corresponds to the termination resistor 23 in FIG. 5.

The port 17b of the hybrid coupler 17 may be connected to a termination resistor 25. The above description of the termination resistor 23 may be applied to the termination resistor 25.

(Operation of Splitter)

The operation of the splitter 301 is as follows.

The operation of the splitter 301 when a signal (e.g., a transmission signal) is input to the transmission terminal 7 is substantially the same as and/or similar to the operation of the splitter 1 when a signal is input to the transmission terminal 7 in the first embodiment. For example, the signal input to the transmission terminal 7 is output to the antenna terminal 5 from the port 17a of the hybrid coupler 17, and is not output from the port 17b. Unlike the first embodiment, a signal flowing toward the hybrid coupler 17 from each transmission filter 13 also flows through the corresponding reception filter 15 in this embodiment. In this case, a signal (e.g., a transmission signal) outside the reception band is reflected by each reception filter 15.

The operation of the splitter 301 when a signal (e.g., a reception signal) is input to the antenna terminal 5 is substantially the same as and/or similar to the operation of the splitter 201 when a signal is input to the antenna terminal 5 in the second embodiment. In other words, the signal input to the antenna terminal 5 passes through each reception filter 15 (reception terminal 9) and is subsequently output to the reception terminal 9 from the port 21d of the hybrid coupler 21, but is not output from the port 21c of the hybrid coupler 21. Unlike the second embodiment, a signal flowing toward each reception filter 15 from the hybrid coupler 17 also flows through the corresponding transmission filter 13 in this embodiment. In this case, a signal (e.g., a reception signal) outside the transmission band is reflected by each transmission filter 13. In order to match a transmission filter and a reception filter with each other, a wire to which the transmission filter and the reception filter are connected normally requires a matching circuit (not illustrated). Examples of the matching circuit include a delay line inserted to an intermediate location of the wire at the reception filter side and an inductor having one terminal connected to the wire and another terminal connected to a reference potential section.

The operation of the splitter 301 when two signals (e.g., transmission signals) are input to the transmission terminal 7 and nonlinear distortions (e.g., PIM) occur in the transmission filters 13 will now be described.

The operation from when the two signals are input to the transmission terminal 7 to when the nonlinear distortions occur in the transmission filters 13 is the same as and/or similar to the operation in the first embodiment described with reference to FIG. 4A. In other words, nonlinear distortions with phases shifted from each other by 90° occur in the transmission filters 13A and 13B. In detail, assuming that the phase of the nonlinear distortion occurring in the transmission filter 13B is 0°, the nonlinear distortion occurring in the transmission filter 13A has a phase of 90°. As in the first embodiment, at least a portion of each of these nonlinear distortions flows to the hybrid coupler 17 and flows toward the antenna terminal 5 from the port 17a.

Unlike the first embodiment, the nonlinear distortion having the phase of 90° occurring in the transmission filter 13A also flows to the reception filter 15A in this embodiment. The nonlinear distortion having the phase of 0° occurring in the transmission filter 13B also flows to the reception filter 15B. The situation in this case is the same as the situation when the nonlinear distortions occurring in the transmission filters 13 are distributed to the reception filters 15A and 15B by the hybrid coupler 17 in the second embodiment. Therefore, as in the second embodiment, the nonlinear distortion (i.e., the nonlinear distortion having the frequency within the reception band) passing through each reception filter 15 is output from the port 21c of the hybrid coupler 21, and is not output to the reception terminal 9 from the port 21d.

Accordingly, in this embodiment, the composite filter (splitter 301) includes a first filter system (transmission filter system 2T) that is the same as and/or similar to that in the first embodiment. The second filter system (i.e., the reception filter system 202R, more specifically, the hybrid coupler 21) electrically connects the port 17c and the port 17d to the reception terminal 9 (i.e., the port 21d from another viewpoint) such that the phase of a signal flowing from the port 17c to the reception terminal 9 is relatively shifted by 90° relative to the phase of a signal flowing from the port 17d to the reception terminal 9 and that the phase difference between the two signals changes by 90°.

Therefore, it is clear from the operation described above that effects identical or similar to those in the first embodiment are exhibited. For example, a nonlinear distortion occurring in each transmission filter 13 and having a frequency within the reception band is distributed to the two reception filters 15A and 15B, and the nonlinear distortions cancel each other out in the hybrid coupler 21. In other words, the nonlinear distortions to be input to the reception terminal 9 are reduced (i.e., eliminated in theory). As a result, the splitter 1 can have improved reception sensitivity.

The second filter system (reception filter system 202R) may include a third filter (reception filter 15A), a fourth filter (reception filter 15B), and a third 90° hybrid coupler (e.g., the hybrid coupler 21). The reception filter 15A may be connected to a third port (port 17c) and may correspond to a second passband (reception band). The reception filter 15B may be connected to a fourth port (port 17d) and may correspond to the reception band. A ninth port (port 21a) may be connected to the reception filter 15A. A tenth port (port 21b) may be connected to the reception filter 15B. A twelfth port (port 21d) may be connected to the reception terminal.

In this case, for example, since there are two reception filters 15 in addition to the transmission filters 13, as compared with the first embodiment, the reception filters 15 can also have enhanced power durability. For example, duplexers can be used as the transmission filter 13A and the reception filter 15A, and other duplexers can be used as the transmission filter 13B and the reception filter 15B.

The splitter 301 may include three termination resistors 23, 25, and 27 that are respectively connected to a second port (port 17b), a seventh port (port 19c), and an eleventh port (port 21c).

In this case, for example, unwanted reflection is reduced. More specifically, the termination resistor 23 has already been described. The termination resistor 25 exhibits effects that are the same as and/or similar to those of the termination resistor 23 with regard to a signal input to the antenna terminal 5 and reflected by the transmission filters 13A and 13B or the reception filters 15A and 15B. PIM caused by two signals input to the transmission terminal 7 is output to the termination resistor 27 from the port 21c. Therefore, reflection of PIM can be reduced by adjusting the impedance of the termination resistor 27.

In the third embodiment described above, the splitter 301 is an example of a composite filter. The antenna terminal 5 is an example of a common terminal. The transmission terminal 7 is an example of a first terminal. The reception terminal 9 is an example of a second terminal. The transmission filter system 2T is an example of a first filter system. The reception filter system 202R is an example of a second filter system. The transmission filter 13A is an example of a first filter. The transmission filter 13B is an example of a second filter. The reception filter 15A is an example of a third filter. The reception filter 15B is an example of a fourth filter. The transmission band is an example of a first passband. The reception band is an example of a second passband. The hybrid coupler 19 is an example of a second hybrid coupler. The hybrid coupler 21 is an example of a third hybrid coupler. The port 21a is an example of a ninth port. The port 21*b* is an example of a tenth port. The port 21*c* is an example of an eleventh port. The port 21*d* is an example of a twelfth port.

This embodiment is different from the first and second embodiments in that the configuration of the splitter 301 does not change even when the transmission filters 13 and the reception filters 15 are interchanged with each other in FIG. 6. From another viewpoint, the aforementioned correspondence relationship may be inverted, such that the reception terminal 9 may be regarded as an example of a first terminal and the transmission terminal 7 may be regarded as an example of a second terminal. The same applies to the first and second filter systems, the first to fourth filters, the first and second passbands, and the fifth to twelfth ports.

[Configuration Example of Elements in Splitter and Usage Example of Splitter]

The configuration example of elements in the splitter according to each embodiment and the usage example of the splitter will be described below. The configuration example and the usage example to be described below may be applied to any of the embodiments described above, unless otherwise noted. However, for the sake of convenience, splitters according to multiple embodiments may sometimes be represented by a reference sign used in any of the embodiments (mainly the first embodiment). A description may sometimes be provided assuming that the configuration of the splitter 1 according to the first embodiment is used.

(Example of Elastic Wave Filter)

As described above, each transmission filter 13 and/or each reception filter 15 may be an elastic wave filter that utilizes an elastic wave. An example of the configuration of an elastic wave filter will be described below.

(Example of Elastic Wave Element)

Figure 7:
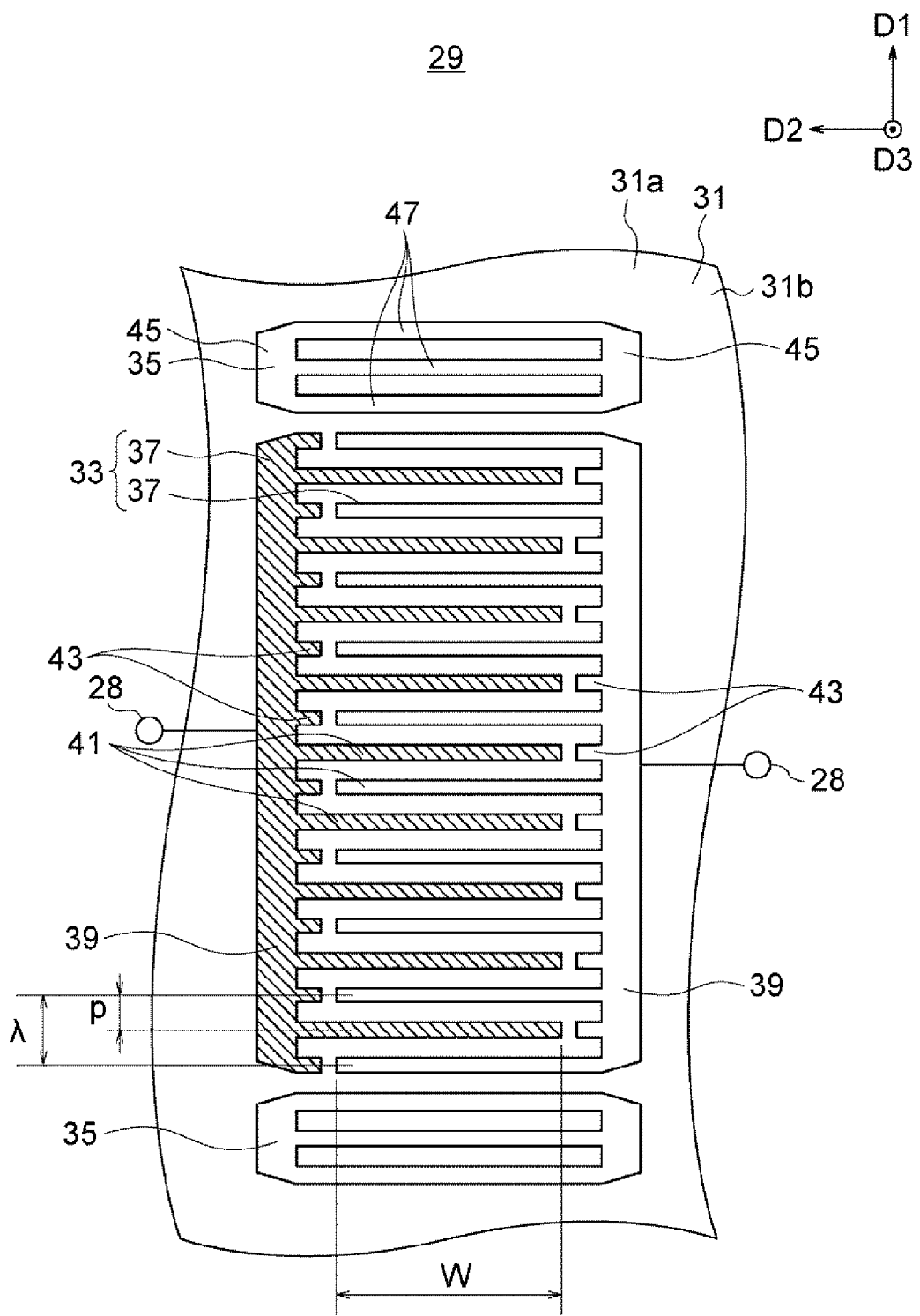
FIG. 7 is a plan view schematically illustrating an example of the configuration of a resonator included in the splitter in FIG. 1.

FIG. 7 is a plan view schematically illustrating the configuration of an elastic wave resonator 29 (sometimes simply referred to as "resonator 29" hereinafter) as an example of an elastic wave element included in the elastic wave filter. In the following description, the term "resonator 29" may be replaced with the term "elastic wave element" so long as there is no contradiction and/or the like.

The resonator 29 may have any of the directions oriented upward or downward. However, for the sake of convenience, an orthogonal coordinate system constituted of a D1 axis, a D2 axis, and a D3 axis is added to the drawing, and a term, such as an upper surface or a lower surface, may be used with the positive side of the D3 axis being the upper side. The D1 axis is defined such as to be parallel to the propagation direction of an elastic wave propagating along the upper surface of a piezoelectric member to be described later. The D2 axis is defined such as to be parallel to the upper surface of the piezoelectric member and orthogonal to the D1 axis. The D3 axis is defined such as to be orthogonal to the upper surface of the piezoelectric member.

The resonator 29 is a so-called one-port elastic wave resonator. The resonator 29 outputs a signal input from one of two terminals 28 schematically illustrated at opposite sides of the drawing from the other one of the two terminals 28. In this case, the resonator 29 converts an electric signal into an elastic wave and converts an elastic wave into an electric signal. It is clear from a description of FIG. 8 to be provided later that each of the terminals 28 may correspond to, for example, any of the antenna terminal 5, the transmission terminal 7, the reception terminal 9, and a reference potential section 11 (to be described later).

The resonator 29 includes, for example, a substrate 31 (i.e., a part of at least an upper surface 31*a* thereof), an excitation electrode 33 located on the upper surface 31*a*, and a pair of reflectors 35 located at opposite sides of the excitation electrode 33. Multiple resonators 29 may be formed on a single substrate 31. In other words, the substrate 31 may be shared by multiple resonators 29. For the sake of convenience, in order to differentiate the multiple resonators 29 sharing the same substrate 31 from each other, a combination (i.e., an electrode section of each resonator 29) of the excitation electrode 33 and the pair of reflectors 35 may be expressed as if the combination is a resonator 29 (i.e., as if the resonator 29 does not include the substrate 31) in the following description.

The substrate 31 has piezoelectricity at least in a region of the upper surface 31*a* provided with the resonator 29. An example of the substrate 31 is a substrate (i.e., a piezoelectric substrate) entirely made of a piezoelectric member. Another example is a so-called laminated substrate. The laminated substrate includes a substrate (piezoelectric substrate) made of a piezoelectric member having the upper surface 31*a* and a support substrate directly bonded to a surface of the piezoelectric substrate opposite the upper surface 31*a* by using an adhesive or without using an adhesive. The support substrate may have or does not need to have a cavity below the piezoelectric substrate. An example of the substrate 31 having piezoelectricity in the region provided with the resonator 29 is a substrate including a support substrate and a film (piezoelectric film) made of a piezoelectric member or a multilayer film including a piezoelectric film formed partially or entirely over a main surface at the +D3 side of the support substrate.

A piezoelectric member 31*b* forming the region of the substrate 31 at least provided with the resonator 29 is made of, for example, a mono-crystal having piezoelectricity. Examples of a material forming such a mono-crystal include lithium tantalate (LiTaO$_3$), lithium niobate (LiNbO$_3$), and quartz (SiO$_2$). The cut angle, the planar shape, and various dimensions may be set as appropriate.

The excitation electrode 33 and the reflectors 35 are made of layered conductors provided on the substrate 31. For example, the excitation electrode 33 and the reflectors 35 are composed of the same material and have the same thickness. The layered conductors are, for example, metal. The metal is, for example, Al or an alloy (Al alloy) with Al as the main component. The Al alloy is, for example, an Al—Cu alloy. Each layered conductor may be made of multiple metallic layers. The thickness of each layered conductor is appropriately set in accordance with the electrical properties and/or the like required in the resonator 29. For example, the thickness of each layered conductor ranges from 50 nm to 600 nm inclusive.

The excitation electrode 33 is a so-called IDT (interdigital transducer) electrode and includes a pair of comb electrodes 37 (one of which is hatched for better visibility). Each comb electrode 37 includes a bus bar 39, multiple electrode fingers 41 extending parallel to each other from the bus bar 39, and multiple dummy electrodes 43 protruding from the bus bar 39 between the multiple electrode fingers 41. The pair of comb electrodes 37 is disposed such that the electrode fingers 41 engage with each other (in an alternating fashion).

For example, each bus bar 39 substantially has a long shape with a fixed width and extending linearly in the propagation direction (D1 direction) of the elastic wave. The pair of bus bars 39 is disposed facing each other in a direction (D2 direction) orthogonal to the propagation direction of the elastic wave. Each bus bar 39 may have varying widths or may be inclined relative to the propagation direction of the elastic wave.

For example, each electrode finger 41 substantially has a long shape with a fixed width and extending linearly in the direction (D2 direction) orthogonal to the propagation direction of the elastic wave. Each electrode finger 41 may have varying widths. In each comb electrode 37, the multiple electrode fingers 41 are arranged in the propagation direction of the elastic wave. The multiple electrode fingers 41 of one of the comb electrodes 37 and the multiple electrode fingers 41 of the other comb electrode 37 are basically arranged in an alternating fashion.

A pitch p (e.g., a center-to-center distance between two neighboring electrode fingers 41) of the multiple electrode fingers 41 is basically fixed within the excitation electrode 33. The excitation electrode 33 may partially have a unique section with respect to the pitch p. Examples of the unique section include a narrow pitch section where the pitch p is narrower than the majority (e.g., 80 percent or higher), a wide pitch section where the pitch p is wider than the majority, and a thinned-out section where a small number of electrode fingers 41 are substantially thinned out.

In the following, the term "pitch p" refers to the pitch in a section (i.e., the majority of the multiple electrode fingers 41) excluding the aforementioned unique section, unless otherwise noted. If the pitch varies in the majority of electrode fingers 41 excluding the unique section, an average value of the pitches of the majority of electrode fingers 41 may be used as the value of the pitch p.

The number of electrode fingers 41 may be appropriately set in accordance with the electrical properties and/or the like required in the resonator 29. Since FIG. 7 is a schematic view, the number of electrode fingers 41 illustrated is small. In actuality, the number of electrode fingers 41 arranged may be larger than the number illustrated. The same applies to strip electrodes 47 of the reflectors 35 to be described later.

The multiple electrode fingers 41 have, for example, the same length. The excitation electrode 33 may be given a so-called apodization treatment in which the length of the multiple electrode fingers 41 (i.e., an engagement width W from another viewpoint) varies depending on the location in the propagation direction. The length and the width of each electrode finger 41 may be appropriately set in accordance with the required electrical properties and/or the like.

For example, the dummy electrodes 43 substantially have a fixed width and protrude in the direction orthogonal to the propagation direction of the elastic wave. The width is, for example, equal to the width of each electrode finger 41. The multiple dummy electrodes 43 are arranged at a pitch equal to that of the multiple electrode fingers 41. The tip of each dummy electrode 43 of one of the comb electrodes 37 faces the tip of the corresponding electrode finger 41 of the other comb electrode 37 with a gap therebetween. The excitation electrode 33 does not need to include the dummy electrodes 43.

The pair of reflectors 35 is located at the opposite sides of the excitation electrode 33 in the propagation direction of the elastic wave. For example, each reflector 35 may be in an electrically floating state or may be supplied with a reference potential. Each reflector 35 is, for example, lattice-shaped. In other words, each reflector 35 includes a pair of bus bars 45 facing each other and multiple strip electrodes 47 extending between the pair of bus bars 45. The pitch between the multiple strip electrodes 47 and the pitch between the electrode finger 41 and the strip electrode 47 that are adjacent to each other are basically equal to the pitch between the multiple electrode fingers 41.

When a voltage is applied to the pair of comb electrodes 37, the multiple electrode fingers 41 apply the voltage to the upper surface 31a having piezoelectricity, thereby causing the upper surface 31a to vibrate. Accordingly, an elastic wave (e.g., SAW) propagating in the D1 direction is excited. The elastic wave is reflected by the multiple electrode fingers 41. Then, a standing wave substantially having a half wavelength ($\lambda/2$) defined by the pitch p between the multiple electrode fingers 41 occurs. An electric signal occurring in the piezoelectric member 31b due to the standing wave is extracted by the multiple electrode fingers 41. In accordance with this principle, the resonator 29 functions as a resonator with a resonant frequency defined by the frequency of the elastic wave having the pitch p as the half wavelength.

Although not particularly illustrated, the resonator 29 may include a protective film (not illustrated) that covers the upper surface 31a of the substrate 31 from above the excitation electrode 33 and the reflectors 35. For example, such a protective film is composed of an insulative material, such as $SiO_2$, and contributes to reducing the probability of corrosion of the excitation electrode 33 and/or the like and/or compensating for a property change occurring due to a temperature change in the resonator 29. The resonator 29 may also include an additional film overlying the upper surface or the lower surface of the excitation electrode 33 and the reflectors 35 and basically having a shape that is within the excitation electrode 33 and the reflectors 35 in plan view. Such an additional film is composed of an insulative material or a metallic material having acoustic properties different from the material of the excitation electrode 33 and/or the like and contributes to an improved elastic-wave reflection coefficient.

In one representative configuration example, the resonator 29 includes one excitation electrode 33, as described above. Alternatively, one resonator 29 may include multiple excitation electrodes 33 connected in series. In other words, one resonator 29 may be divided into multiple pieces. In this case, for example, a voltage applied to the resonator 29 is distributed to the multiple excitation electrodes 33, so that the resonator 29 can have enhanced power durability. Since the vibration of the elastic wave is reduced, a nonlinear distortion is reduced.

(Configuration Example of Splitter Unit Equipped with Elastic Wave Filters)

Figure 8:
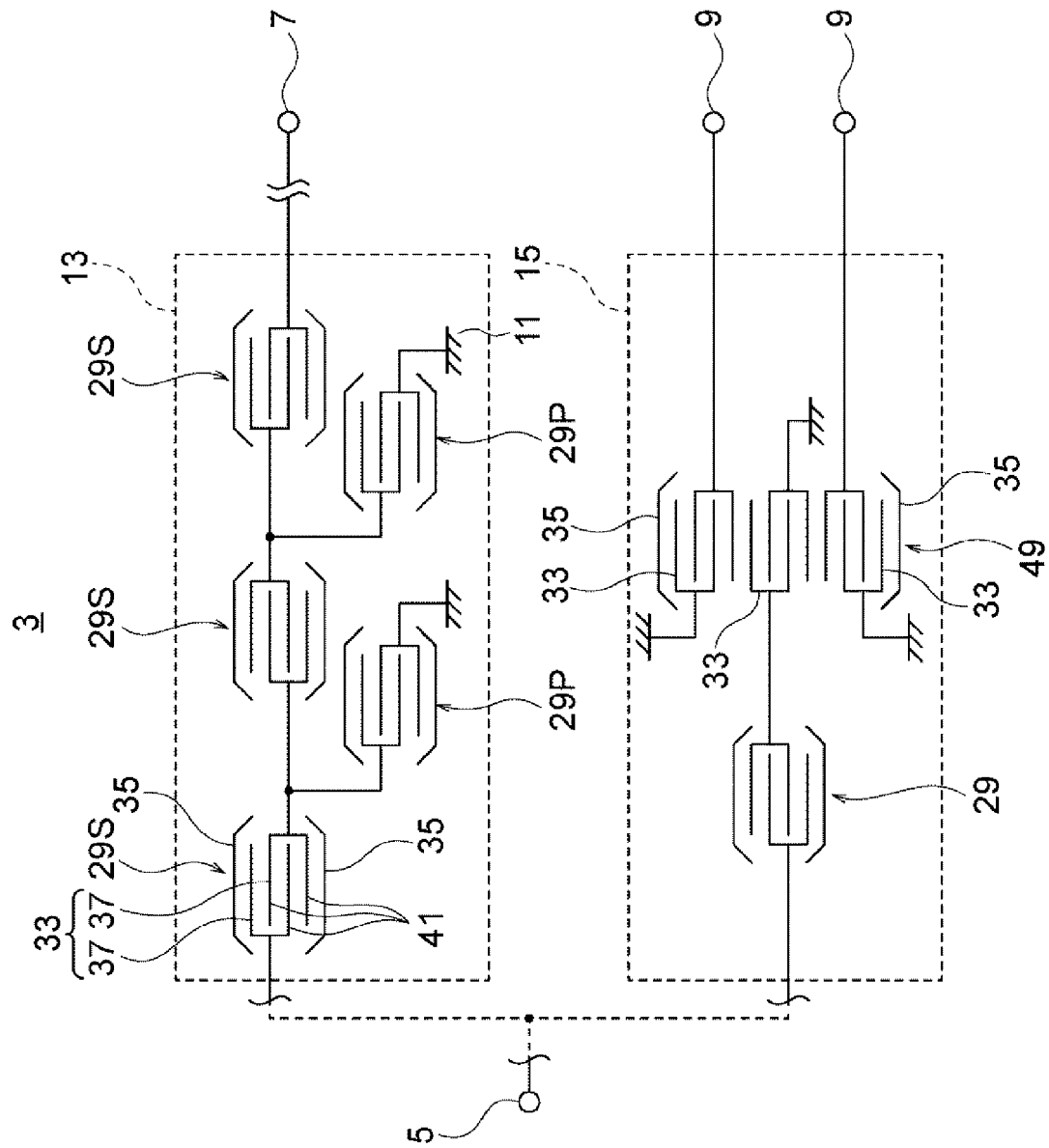
FIG. 8 is a circuit diagram schematically illustrating an example of the configuration of a splitter unit included in the splitter in FIG. 1.

FIG. 8 is a circuit diagram schematically illustrating the configuration of the splitter unit 3 (i.e., a section including a transmission filter 13 and a reception filter 15 and directly contributing to filtering). In this drawing, only the splitter unit 3 and the terminals of the splitter 1 are illustrated. In other words, the hybrid couplers 17 and 19 and/or the like are not illustrated. Only one of the transmission filters 13A and 13B is illustrated.

It is clear from reference signs indicated at the upper left corner of this drawing that each of the comb electrodes 37 is schematically illustrated using a bifurcated fork shape, and that each of the reflectors 35 is expressed with a single line with bent opposite ends. In the following description, the term "splitter unit 3" may be replaced with the term "splitter 1" so long as there is no contradiction and/or the like.

As mentioned above, the splitter unit 3 includes the antenna terminal 5, the transmission terminal 7, the reception terminal 9, the transmission filter 13, and the reception filter 15. The splitter unit 3 also includes the reference potential section 11. The reference potential section 11 is a section (conductor) to be supplied with a reference potential, and more specifically, may be a terminal to be supplied with a reference potential or a component (e.g., a shield) other than a terminal.

The antenna terminal 5 and each of the filters (13 and 15) are connected to each other via the hybrid coupler 17. In FIG. 8, the connection between the antenna terminal 5 and each filter is indicated by a dotted line without the hybrid coupler 17 for the sake of convenience. The transmission terminal 7 and the transmission filter 13 are connected to each other via the hybrid coupler 19. For the sake of convenience, in the following description, the connection relationship may sometimes be described as if the hybrid couplers 17 and 19 are not provided.

Unlike FIG. 1, two reception terminals 9 are illustrated in FIG. 8. This is because, in the configuration illustrated in FIG. 8, the reception filter 15 is configured to output a balanced signal including two signals with opposite phases. However, the reception filter 15 may output an unbalanced signal including one signal whose signal level changes relative to the reference potential (i.e., only one reception terminal 9 may be provided). In the splitter 1 according to the first embodiment, it is apparent that two reception terminals 9 may be used. In the splitter 201 according to the second embodiment, for example, each reception terminal 9 may be provided with a hybrid coupler 19 (i.e., a total of two hybrid couplers 19 may be provided), so that two reception terminals 9 may be used. The same applies to the splitter 301 according to the third embodiment.

The transmission filter 13 is, for example, a ladder filter constituted by connecting multiple resonators 29 (29S and 29P) into a ladder shape. In other words, the transmission filter 13 includes multiple (or may be one) series resonators 29S connected in series between the transmission terminal 7 and the antenna terminal 5 and multiple (or may be one) parallel resonators 29P (parallel arm) that connect the series line (series arm) of the series resonators 29S to the reference potential section 11.

The reception filter 15 includes, for example, a resonator 29 and a multi-mode filter 49 (including a double-mode filter, and sometimes referred to as "MM filter 49" hereinafter). The MM filter 49 includes multiple (i.e., three in the illustrated example) excitation electrodes 33 arranged in the propagation direction of the elastic wave and a pair of reflectors 35 disposed at the opposite sides of the multiple excitation electrodes 33.

The configuration of the transmission filter 13 and the reception filter 15 described above is merely an example and may be modified as appropriate. For example, the reception filter 15 may be a ladder filter, similarly to the transmission filter 13, or the transmission filter 13 may include the MM filter 49.

In the configuration described above, the multiple resonators 29 (29S, 29P, and the resonator 29 of the reception filter 15) and the MM filter 49 may be regarded as elastic wave elements. These multiple elastic wave elements may be provided on one substrate 31, or may be provided distributively on two or more substrates 31. For example, the multiple resonators 29 constituting the transmission filter 13 may be provided on the same substrate 31. Likewise, the resonator 29 and the MM filter 49 constituting the reception filter 15 may be provided on the same substrate 31. The transmission filters 13A and 13B may be provided on the same substrate 31 or may be provided on different substrates 31. Likewise, the reception filters 15A and 15B may be provided on the same substrate 31 or may be provided on different substrates 31. The transmission filter 13 (one or two) and the reception filter 15 (one or two) may be provided on the same substrate 31 or may be provided on different substrates 31. With respect to one filter, the multiple series resonators 29S may be provided on a single substrate 31, and the multiple parallel resonators 29P may be provided on another single substrate 31.

(Example of Sharing of Substrate by Elastic Wave Elements)

As mentioned above, the multiple elastic wave elements (such as the elastic wave resonators 29) may be appropriately disposed on one or more substrates 31. The following is an example.

Figure 9:
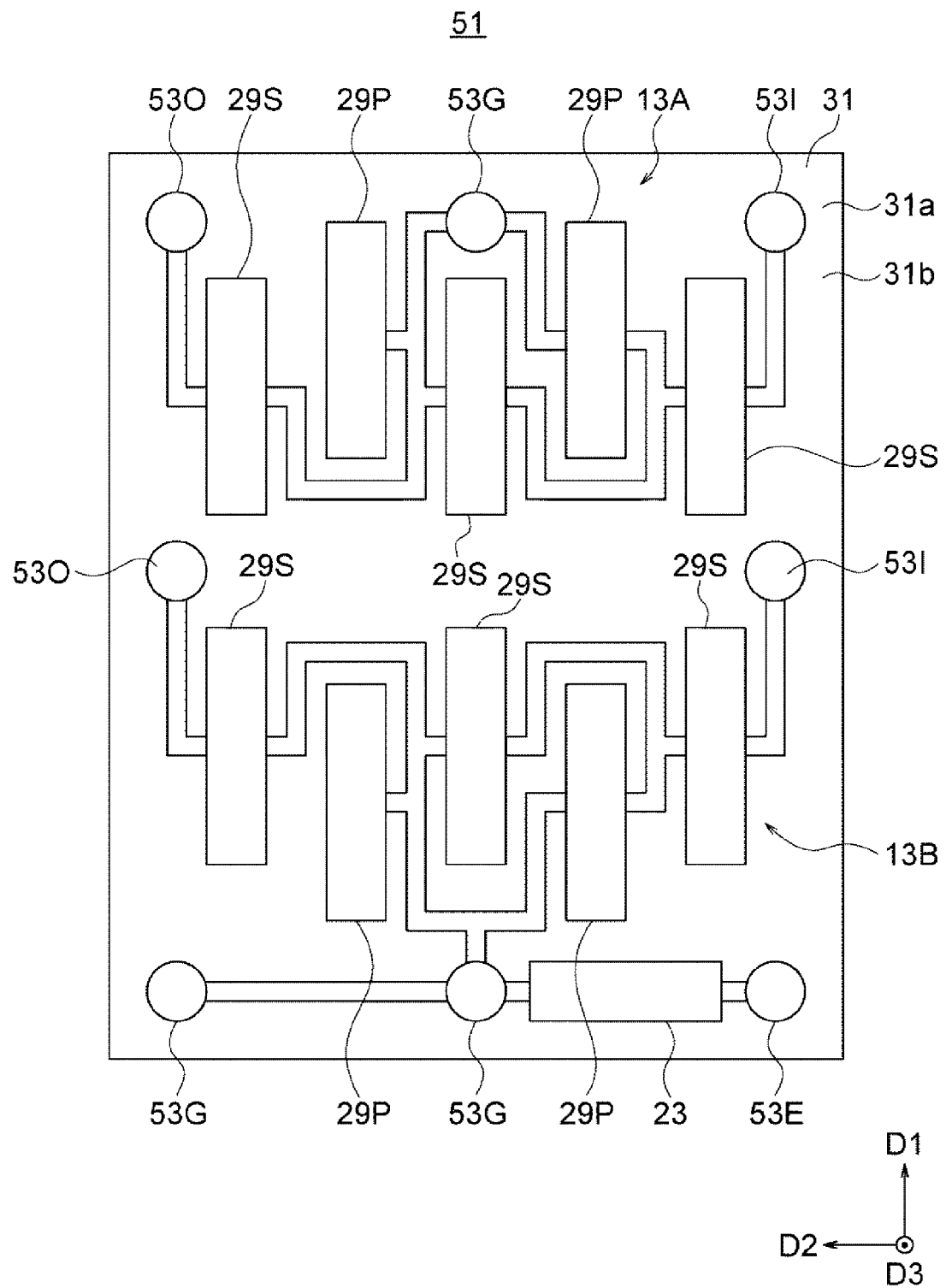
FIG. 9 is a plan view illustrating an example of a chip included in the splitter unit in FIG. 8.

FIG. 9 is a plan view illustrating an example of a chip 51 included in the splitter unit 3. It is clear from the orthogonal coordinate system D1-D2-D3 that this drawing illustrates the upper surface 31a of the substrate 31. Moreover, this drawing is a schematic diagram expressing each of the resonators 29 (29S and 29P) with a rectangle.

The chip 51 includes the transmission filters 13A and 13B made of ladder filters on the same substrate 31. The chip 51 also includes multiple terminals (53I, 53O, 53G, and 53E) electrically connected to a circuit substrate on which the chip 51 is mounted. Two terminals 53I receive transmission signals. For example, in the splitter 1, the two terminals 53I are connected to the ports 19a and 19b of the hybrid coupler 19, and by extension, to the transmission terminal 7. Two terminals 53O output filtered transmission signals. For example, in the splitter 1, the two terminals 53O are connected to the ports 17c and 17d of the hybrid coupler 17, and by extension, to the antenna terminal 5. Multiple (three in the illustrated example) terminals 53G are supplied with a reference potential. A terminal 53e will be described later.

As mentioned above, the transmission filters 13A and 13B may substantially have the same configuration. For example, the transmission filters 13A and 13B may have the same number of series resonators 29S and parallel resonators 29P, and the resonators 29 corresponding to each other may have the same configuration. For example, the resonators 29 having the same configuration may have the same shape and size, may be composed of the same material, and may have the same crystal orientation of the substrate 31 in the electrode section (i.e., the excitation electrode 33 and the reflectors 35). However, sections not essential for the filters may be different between the transmission filters 13A and 13B. For example, the relative position between the multiple resonators 29 in the orthogonal coordinate system D1-D2-D3, the shape and the length of the wire that connects the resonators 29 to each other, and/or the like may be different between the transmission filters 13A and 13B.

Accordingly, the first filter and the second filter (i.e., the transmission filters 13A and 13B) may be located in the same piezoelectric member 31b.

In this case, for example, the aforementioned effect of reducing a nonlinear distortion is enhanced. Details are as follows. In a mode where the transmission filters 13A and 13B are provided in different piezoelectric members 31b (i.e., this mode is also included in the technology according to the present disclosure), the transmission filters 13A and 13B may have the same configuration in design but may have different properties due to patterning of the electrodes and/or a manufacturing error of the piezoelectric member 31b and/or the like. As a result, a nonlinear distortion that has occurred in the transmission filter 13A and a nonlinear distortion that has occurred in the transmission filter 13B have different intensities and/or different phases. This may possibly reduce the effect of cancelling out the nonlinear distortions. By providing the transmission filters 13A and 13B in the same piezoelectric member 31b, the probability of an occurrence of such a problem can be reduced.

The transmission filters 13A and 13B (according to the first embodiment and/or the like) are described as an example of the first filter and the second filter located in the same piezoelectric member 31b. Alternatively, the first filter and the second filter located in the same piezoelectric member 31b may be the reception filters 15A and 15B (according to the second embodiment and/or the like). As another alternative, the third filter and the fourth filter (i.e., the reception filters 15A and 15B according to the third embodiment) may be located in the same piezoelectric member 31b.

Figure 10:
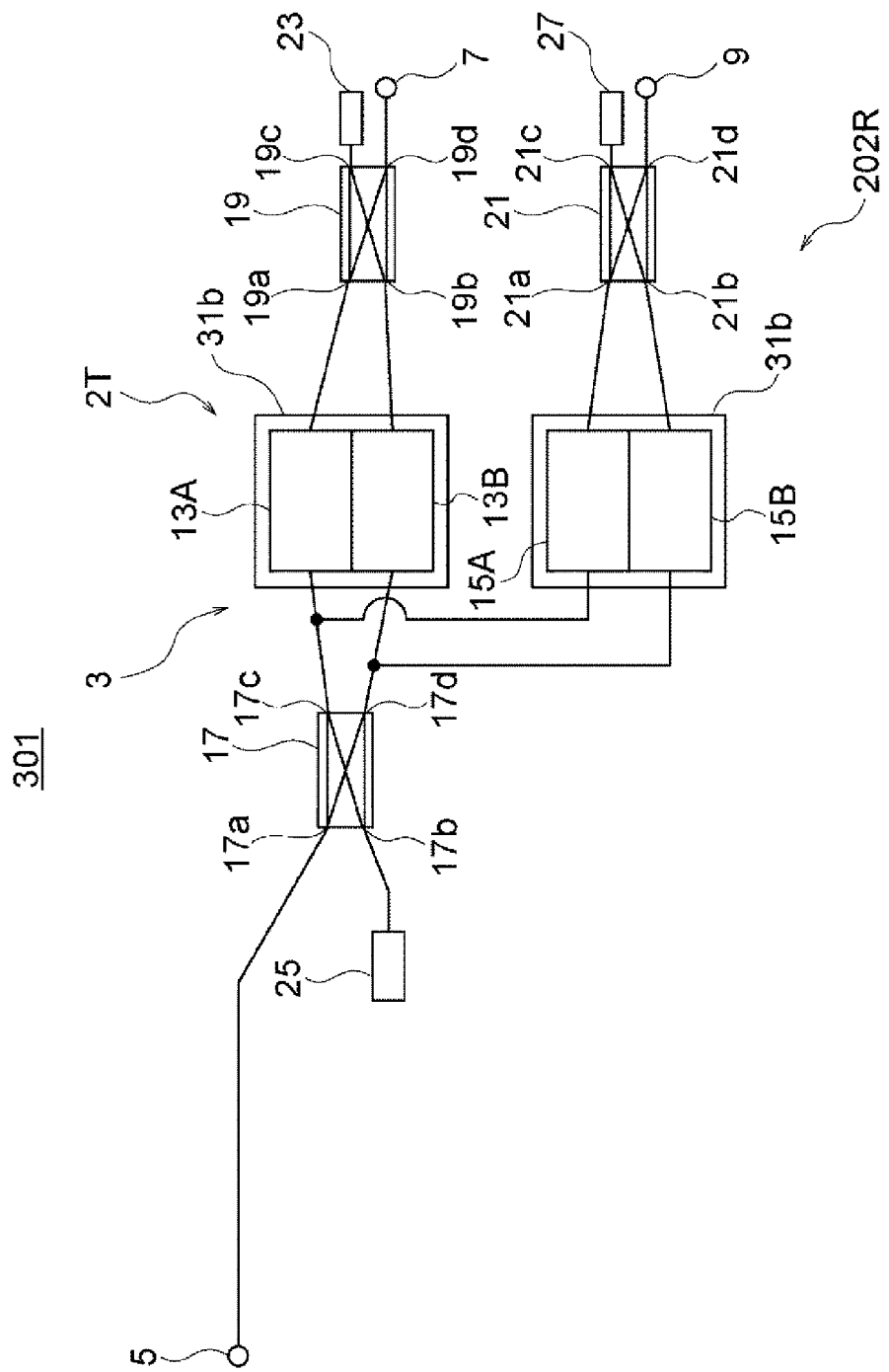
FIG. 10 is a circuit diagram illustrating the configuration of a variation of the splitter in FIG. 6.

FIG. 10 is a schematic diagram illustrating an example of sharing of the piezoelectric member 31b in the third embodiment.

As illustrated in this drawing, the transmission filters 13A and 13B may share a piezoelectric member 31b (i.e., a substrate 31 from another viewpoint). In addition, the reception filters 15A and 15B may share a piezoelectric member 31b (substrate 31). Accordingly, the transmission filters 13 and the reception filters 15 share the respective piezoelectric members 31b, so that the effect of cancelling out nonlinear distortions is enhanced, as mentioned above.

In the illustrated example, the piezoelectric member 31b shared by the transmission filters 13A and 13B and the piezoelectric member 31b shared by the reception filters 15A and 15B are different piezoelectric members 31b (i.e., different substrates 31). In this case, for example, the probability of an increase in size of each substrate 31 (i.e., each chip component from another viewpoint) is reduced. Although the following description is redundant with the above description, the four filters may all be provided on a single substrate 31 (piezoelectric member 31b), unlike the illustrated example. Of the four filters, only the transmission filters 13A and 13B may share a piezoelectric member 31b, or only the reception filters 15A and 15B may share a piezoelectric member 31b.

(Example of Termination Resistor)

Referring back to FIG. 9, the termination resistor 23 may be a conductive pattern formed on a circuit substrate, as mentioned above. FIG. 9 illustrates an example. In this example, the termination resistor 23 is a conductive pattern formed on the upper surface 31a of the substrate 31. However, a specific shape of the conductive pattern is omitted from the drawing, and an example of a region where the conductive pattern is disposed is schematically expressed with a rectangle. The conductive pattern may have an appropriate shape and extend in, for example, a meandering manner. The termination resistor 23 is connected to the terminal 53e and the terminals 53G that are to be supplied with a reference potential. The terminal 53e is connected to the port 19c of the hybrid coupler 19.

Accordingly, the termination resistor 23 may be located in the piezoelectric member 31b where at least one of the first filter, the second filter, and the third filter (as well as the fourth filter) (i.e., the transmission filters 13A and 13B as the first and second filters in the illustrated example) is located.

In this case, for example, the termination resistor 23 can be formed at the same time as when the electrode section of the filter is formed, so that cost reduction can be expected. By utilizing photolithography, the accuracy for forming the electrode section increases, thereby achieving enhanced filter properties.

FIG. 9 illustrates a mode where the piezoelectric member 31b provided with the termination resistor 23 is provided with the transmission filters 13A and 13B. However, it is clear from the previous description that the piezoelectric member 31b provided with the termination resistor 23 may be the piezoelectric member 31b where the reception filter 15 according to the first embodiment (or the reception filters 15A and/or 15B according to the third embodiment) is located in addition to or in place of the transmission filters 13A and 13B, the piezoelectric member 31b where only one of the transmission filters 13A and 13B is located, the piezoelectric member 31b where only one of the transmission filters 13 according to the second embodiment is located, or the piezoelectric member 31b where one of or each of the two reception filters 15A and 15B according to the second embodiment is located in place of or in addition to the one transmission filter 13.

Although the above description is provided with reference to the termination resistor 23 as an example, the above description may be applied to the termination resistors 25 and 27 according to the third embodiment so long as there is no contradiction and/or the like. For example, in the third embodiment, at least one of the termination resistors 23, 25, and 27 may be located in the piezoelectric member 31b where at least one of the first to fourth filters (i.e., the transmission filters 13A and 13B and the reception filters 15A and 15B) is located.

(Structural Example of Splitter)

The splitter may have an appropriate structure. Three examples are described below. For the sake of convenience, the reference sign for the splitter 201 according to the second embodiment is given. However, the structural example described below may be applied to the other embodiments.

Figure 11A:
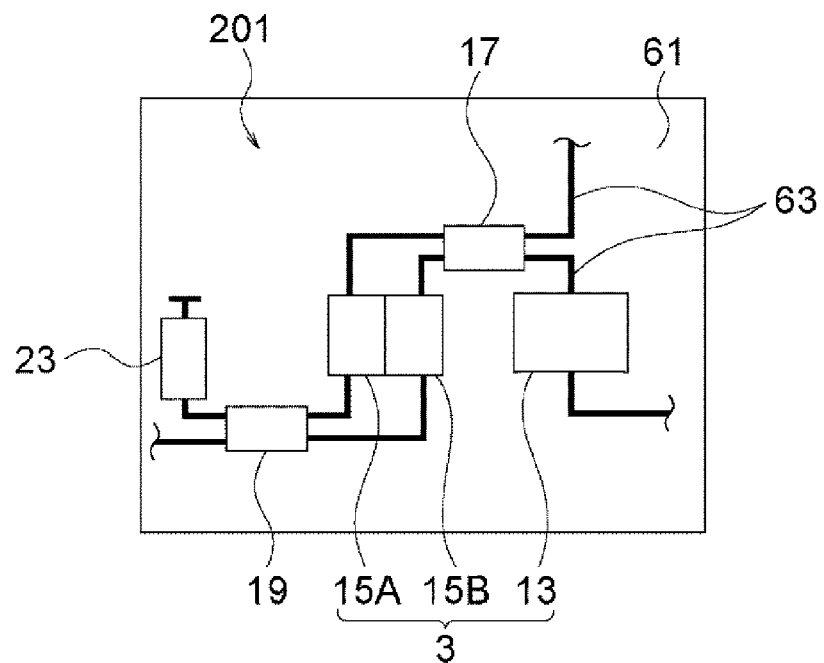
FIG. 11A is a plan view illustrating an example of the structure of a splitter according to an embodiment.

FIG. 11A is a plan view illustrating an example of the structure of the splitter 201.

In this example, each of the elements (13, 15A, 15B, 17, 19, and 23) constituting the splitter 201 is a packaged electronic component. These electronic components are mounted on a circuit substrate 61 and are connected to one another by a wire 63 of the circuit substrate 61. Although not particularly illustrated, the circuit substrate 61 may have mounted thereon another electronic component connected to the splitter 201 and/or an electronic component not connected to the splitter 201. In other words, the splitter 201 may be a part of a printed circuit board (i.e., a printed wiring board and an electronic component mounted on the printed wiring board). Accordingly, in the splitter 201, the elements other than the splitter unit 3 may be external electronic components of the splitter unit 3 instead of being packaged together with the splitter unit 3.

Figure 11B:
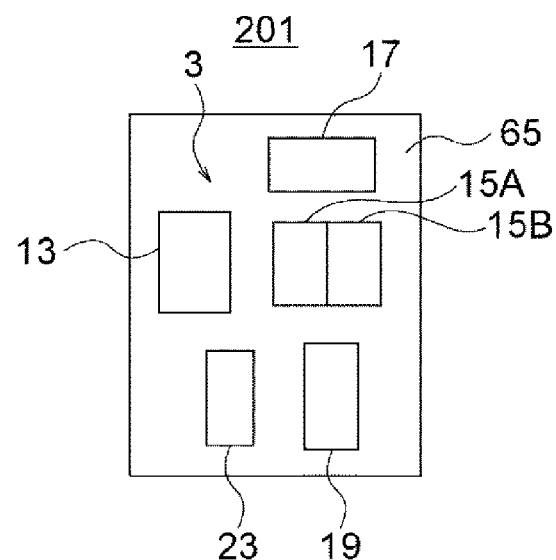
FIG. 11B is a plan view illustrating another example of the structure of the splitter according to the embodiment.

FIG. 11B is a plan view illustrating another example of the structure of the splitter 201.

In this example, the elements (13, 15A, 15B, 17, 19, and 23) constituting the splitter 201 are packaged together into a single electronic component. For example, the splitter 201 includes a circuit substrate 65 having the elements mounted thereon. The transmission filter 13 and the reception filters 15A and 15B may be in, for example, a bare chip state or a wafer level packaged state. The other elements may be in a packaged state or may be in a non-packaged state. The multiple elements constituting the splitter 201 are sealed together by using resin (not illustrated) covering the upper surface of the circuit substrate 65. The circuit substrate 65 is provided with the antenna terminal 5, the transmission terminal 7, and the reception terminal 9 at appropriate locations.

Figure 11C:
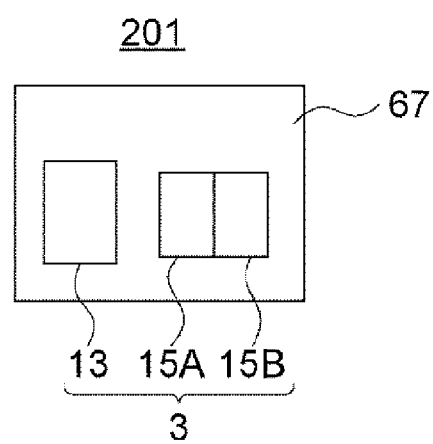
FIG. 11C is a plan view illustrating yet another example of the structure of the splitter according to the embodiment.

FIG. 11C is a plan view illustrating yet another example of the structure of the splitter 201.

In this example, the elements (13, 15A, 15B, 17, 19, and 23) constituting the splitter 201 are packaged together into a single electronic component, similarly to the example in FIG. 11B. For example, the splitter 201 includes a circuit substrate 67 having the elements mounted thereon. However, one or more of the elements (i.e., all of the elements other than the splitter unit 3 in the illustrated example) are contained within the circuit substrate 67. In other words, each element is formed by providing a conductor inside the circuit substrate 67 or on the surface thereof.

Each of the circuit substrates 61, 65, and 67 may be of any of known various types. For example, each of these substrates may be an LTCC (low temperature co-fired ceramic) substrate, an HTCC (high temperature co-fired ceramic) substrate, or an organic substrate.

The structural examples in FIG. 11A to FIG. 11C may be combined. For example, of multiple elements (17, 19, and 23) other than the splitter unit 3, one or more elements may be packaged together with the splitter unit 3, and the remaining one or more elements may be external elements. If the multiple elements (17, 19, and 23) other than the splitter unit 3 are entirely or partially packaged together with the splitter unit 3, the packaged one or more of the multiple elements may be mounted on the circuit substrate, whereas the remaining one or more elements may be contained within the circuit substrate. Furthermore, for example, one or more of the elements may be contained within the circuit substrate 61 having an external element mounted thereon.

(Communication Device)

Figure 12:
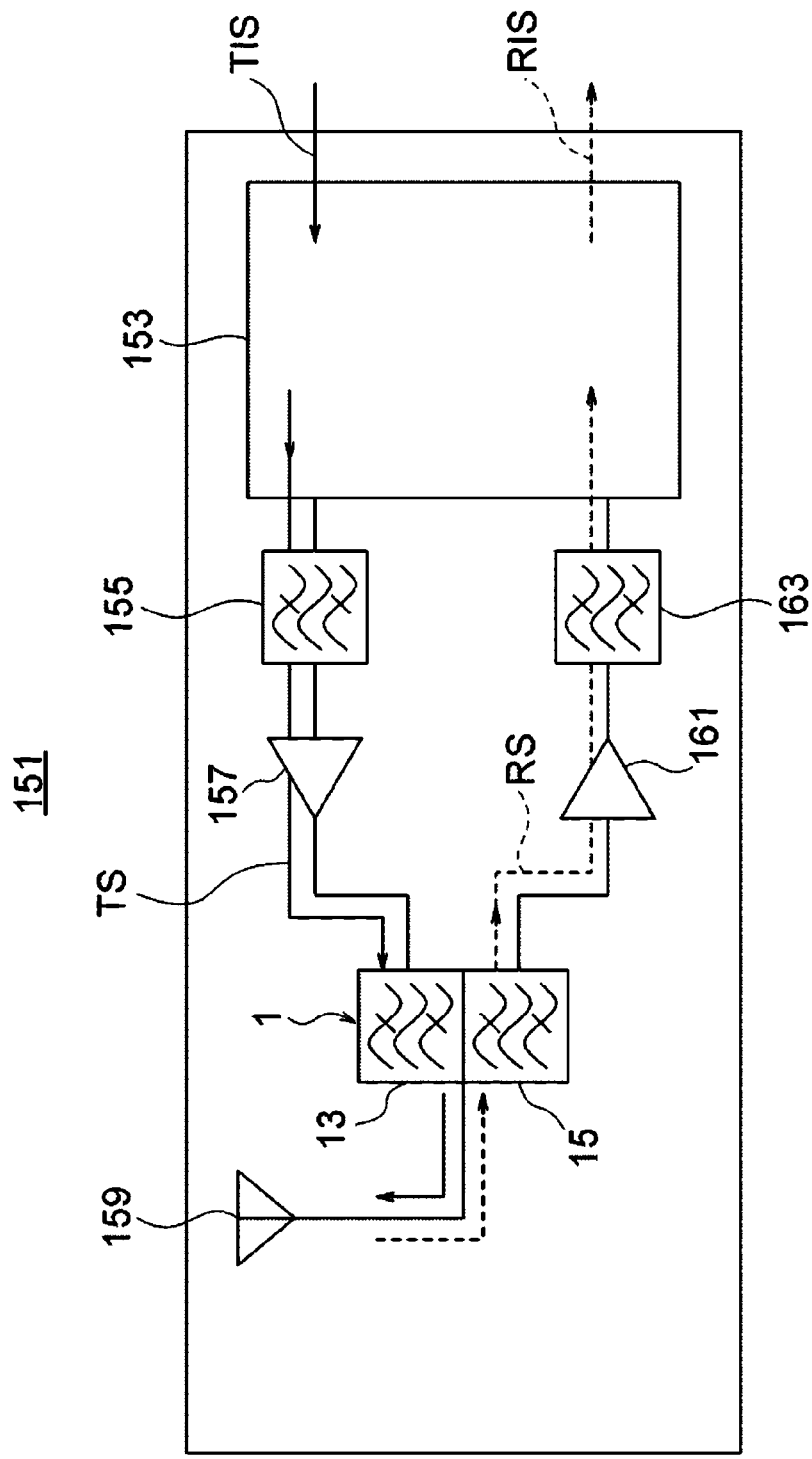
FIG. 12 is a block diagram illustrating the configuration of a communication device as a usage example of the splitter according to the embodiment.

FIG. 12 is a block diagram illustrating a relevant part of a communication device 151 as a usage example of the splitter 1. The communication device 151 performs wireless communication by using a radio wave, and includes, for example, the splitter 1. In this case, only the transmission filters 13 and the reception filter 15 of the splitter 1 are illustrated. The two transmission filters 13A and 13B are expressed as a single transmission filter 13.

In the communication device 151, a transmission information signal TIS containing information to be transmitted undergoes modulation and frequency raise (i.e., conversion to a high frequency signal having a carrier frequency) by an RF-IC (radio frequency integrated circuit) 153, so as to become a transmission signal TS. The transmission signal TS undergoes removal of an unwanted component outside the transmission passband therefrom by a bandpass filter 155, is amplified by an amplifier 157, and is input to the splitter 1 (transmission terminal 7). Then, the splitter 1 (transmission filter 13) removes an unwanted component outside the transmission passband from the input transmission signal TS and outputs the transmission signal TS having undergone the removal to an antenna 159 from the antenna terminal 5. The antenna 159 converts the input electric signal (transmission signal TS) into a wireless signal (radio wave) and transmits the wireless signal.

In the communication device 151, the wireless signal (radio wave) received by the antenna 159 is converted into an electric signal (reception signal RS) by the antenna 159, and the electric signal (reception signal RS) is input to the splitter 1 (antenna terminal 5). The splitter 1 (reception filter 15) removes an unwanted component outside the reception passband from the input reception signal RS and outputs the reception signal RS from the reception terminal 9 to an amplifier 161. The output reception signal RS is amplified by the amplifier 161, and undergoes removal of an unwanted component outside the reception passband by a bandpass filter 163. Then, the reception signal RS undergoes frequency reduction and demodulation by the RF-IC 153, so as to become a reception information signal RIS.

Each of the transmission information signal TIS and the reception information signal RIS may be a low frequency signal (baseband signal) containing appropriate information, and is, for example, an analog audio signal or a digitalized signal. The passband for the wireless signal may be set as appropriate, and may be a relatively high frequency passband (e.g., equal to or higher than 5 GHz). The modulation method may be phase modulation, amplitude modulation, frequency modulation, or a combination of two or more of these methods. Although a direct conversion system is illustrated in FIG. 12 as a circuit system, the circuit system may be an appropriate system other than the direct conversion system and may be, for example, a double superheterodyne system. FIG. 12 schematically illustrates the relevant part alone and may have a low-pass filter, an isolator, and/or the like added to an appropriate location or locations or may have the amplifiers and/or the like at modified locations.

The technology according to the present disclosure is not limited to the above embodiments and may be implemented in various modes.

The composite filter is not limited to a duplexer. For example, the composite filter may include two transmission filter systems with different passbands as the first filter system and the second filter system. From another viewpoint, a process of simultaneously inputting two signals having different frequencies within the first passband to the first terminal and a process of simultaneously inputting two signals having different frequencies within the second passband different from the first passband to the second terminal may both be performed. The composite filter may include another filter system in addition to the first filter system and the second filter system. For example, the composite filter may be a triplexer including three filter systems or may be a quadplexer including four filter systems.

REFERENCE SIGNS

1 splitter (composite filter)
2T transmission filter system (first filter system)
2R reception filter system (second filter system)
5 antenna terminal (common terminal)
7 transmission terminal (first terminal or second terminal)
9 reception terminal (second terminal or first terminal)
13 transmission filter (first filter, second filter, third filter, or fourth filter)
13A transmission filter (first filter or third filter)
13B transmission filter (second filter or fourth filter)
15 reception filter (first filter, second filter, third filter, or fourth filter)
15A reception filter (first filter or third filter)
15B reception filter (second filter or fourth filter)
17 90° hybrid coupler
17a port (first port)
17b port (second port)
17c port (third port)
17d port (fourth port)
19 90° hybrid coupler
19a port (fifth port)
19b port (sixth port)
19c port (seventh port)
19d port (eighth port)
21 90° hybrid coupler
21a port (ninth port)
21b port (tenth port)
21c port (eleventh port)
21d port (twelfth port)

The invention claimed is:

1. A composite filter that performs at least one of a process of simultaneously inputting two signals having different frequencies within a first passband to a first terminal and a process of simultaneously inputting two signals having different frequencies within a second passband to a second terminal, the composite filter comprising:
- a common terminal;
- the first terminal;
- the second terminal;
- a first filter system connecting the common terminal and the first terminal to each other;
- a second filter system connecting the common terminal and the second terminal to each other, wherein the second filter system comprises: a third filter corresponding to the second passband and connecting a second port and the second terminal to each other; and
- a first 90° hybrid coupler connected to the common terminal that is shared by the first filter system and the second filter system, wherein the first 90° hybrid coupler comprises a first port that is connected to the common terminal, the second port, a third port electrically connected to the first port and the second port, and a fourth port electrically connected to the first port and the second port, the fourth port being a port to which a signal with a phase shifted by 90° relative to a phase of a signal distributed from the first port to the third port is distributed from the first port, and
- wherein the first filter system comprises:
  - a first filter connected to the third port and corresponding to the first passband;
  - a second filter connected to the fourth port and corresponding to the first passband; and
  - a second 90° hybrid coupler connecting the first filter and the second filter to the first terminal,
- wherein the second 90° hybrid coupler comprises:
  - a fifth port,
  - a sixth port,
  - a seventh port electrically connected to the fifth port that is connected to the first filter and the sixth port that is connected to the second filter,
  - an eighth port electrically connected to the fifth port, the sixth port and the first terminal, the eighth port being a port to which a signal with a phase shifted by 90° relative to a phase of a signal distributed from the fifth port to the seventh port is distributed from the fifth port, and
  - a termination resistor connected to the seventh port, wherein the termination resistor is located at a piezoelectric member where at least one of the first filter, the second filter, and the third filter is located
- wherein the second filter system electrically connects the third port and the fourth port to the second terminal and relatively shifts a phase of a signal flowing from the third port toward the second terminal by 90° relative to a phase of a signal flowing from the fourth port toward the second terminal to change a phase difference between the two signals by 90°.

2. The composite filter according to claim 1, wherein each of the first filter and the second filter is a piezoelectric filter, the first filter and the second filter being located at a single piezoelectric member.

3. A communication device comprising:
the composite filter according to claim 1;
an antenna connected to the common terminal; and
an integrated circuit element connecting the first terminal and the second terminal to each other and performing at least one of the process of simultaneously inputting two signals having different frequencies within the first passband to the first terminal and the process of simultaneously inputting two signals having different frequencies within the second passband to the second terminal.

4. A composite filter that performs at least one of a process of simultaneously inputting two signals having different frequencies within a first passband to a first terminal and a process of simultaneously inputting two signals having different frequencies within a second passband to a second terminal, the composite filter comprising:
- a common terminal;
- the first terminal;
- the second terminal;
- a first filter system connecting the common terminal and the first terminal to each other;
- a second filter system connecting the common terminal and the second terminal to each other; and
- a first 90° hybrid coupler connected to the common terminal that is shared by the first filter system and the second filter system, wherein the first 90° hybrid coupler comprises a first port that is connected to the common terminal, a second port, a third port electrically connected to the first port and the second port, and a fourth port electrically connected to the first port and the second port, the fourth port being a port to which a signal with a phase shifted by 90° relative to a phase of a signal distributed from the first port to the third port is distributed from the first port,
- wherein the first filter system comprises:
  - a first filter connected to the third port and corresponding to the first passband;
  - a second filter connected to the fourth port and corresponding to the first passband; and
  - a second 90° hybrid coupler connecting the first filter and the second filter to the first terminal,
- wherein the second 90° hybrid coupler comprises:
  - a fifth port,
  - a sixth port,
  - a seventh port electrically connected to the fifth port that is connected to the first filter and the sixth port that is connected to the second filter, and
  - an eighth port electrically connected to the fifth port, the sixth port and the first terminal, the eighth port being a port to which a signal with a phase shifted by 90° relative to a phase of a signal distributed from the fifth port to the seventh port is distributed from the fifth port,
- wherein the second filter system electrically connects the third port and the fourth port to the second terminal and relatively shifts a phase of a signal flowing from the third port toward the second terminal by 90° relative to a phase of a signal flowing from the fourth port toward the second terminal to change a phase difference between the two signals by 90°
- wherein the second filter system comprises:
  - a third filter connected to the third port and corresponding to the second passband,
  - a fourth filter connected to the fourth port and corresponding to the second passband, and
  - a third 90° hybrid coupler connecting the third filter and the fourth filter to the second terminal,
- wherein third 90° hybrid coupler comprises:
  - a ninth port that is connected to the third filter,
  - a tenth port that is connected to the fourth filter,
  - an eleventh port electrically connected to the ninth port and the tenth port, and
  - a twelfth port electrically connected to the ninth port, the tenth port and the second terminal, the twelfth port being a port to which a signal with a phase shifted by 90° relative to a phase of a signal distributed from the ninth port to the eleventh port is distributed from the ninth port.

5. The composite filter according to claim 4, wherein at least one of conditions is satisfied, the conditions comprising:
a condition in which each of the first filter and the second filter is a piezoelectric filter, the first filter and the second filter being located at a single piezoelectric member; and
a condition in which each of the third filter and the fourth filter is a piezoelectric filter, the third filter and the fourth filter being located at a single piezoelectric member.

6. The composite filter according to claim 4, further comprising:
three termination resistors respectively connected to the second port, the seventh port, and the eleventh port.

7. The composite filter according to claim 6, wherein at least one of the three termination resistors is located at a piezoelectric member where at least one of the first filter, the second filter, the third filter, and the fourth filter is located.

8. A communication device comprising:
the composite filter according to claim 4;
an antenna connected to the common terminal; and
an integrated circuit element connecting the first terminal and the second terminal to each other and performing at least one of the process of simultaneously inputting two signals having different frequencies within the first passband to the first terminal and the process of simultaneously inputting two signals having different frequencies within the second passband to the second terminal.

* * * * *